United States Patent [19]

Ishii et al.

[11] Patent Number: 5,698,036
[45] Date of Patent: Dec. 16, 1997

[54] PLASMA PROCESSING APPARATUS

[75] Inventors: Nobuo Ishii, Yamanashi-ken; Yasuo Kobayashi, Nirasaki; Naohisa Goto, 6-15-1-A514, Tsuchihashi, Miyamae-ku, Kawasaki-shi, Kanagawa-ken; Makoto Ando, 1-1-I-312 Ogura, Saiwai-ku, Kawasaki-shi, Kanagawa-ken; Junichi Takada, 5-36-8-102 Futawahigashi, Funabashi-shi, Chiba-ken; Yasuhiro Horike, 3-2-12 Higashifushimi, Hoya-shi, Tokyo, all of Japan

[73] Assignees: Tokyo Electron Limited, Tokyo; Naohisa Goto; Makoto Ando, both of Kawasaki; Junichi Takada, Funabashi; Yasuhiro Horike, Tokyo, all of Japan

[21] Appl. No.: 653,469

[22] Filed: May 24, 1996

[30] Foreign Application Priority Data

May 26, 1995 [JP] Japan ................. 7-152678
Aug. 25, 1995 [JP] Japan ................. 7-240876

[51] Int. Cl.$^6$ .............................. C23C 16/00
[52] U.S. Cl. ................. 118/723 MW; 118/723 MP
[58] Field of Search ................. 118/723 MW, 118/723 MR, 723 MA, 723 MP, 723 AN; 156/345; 216/69, 70; 204/298.38

[56] References Cited

U.S. PATENT DOCUMENTS

| 5,364,519 | 11/1994 | Fujimura et al. | 204/298.38 |
| 5,538,699 | 7/1996 | Suzuki | 422/186.29 |
| 5,545,258 | 8/1996 | Katayama et al. | 118/723 MP |
| 5,562,775 | 10/1996 | Mihara | 118/723 MW |

FOREIGN PATENT DOCUMENTS

| 58-13626 | 3/1983 | Japan . |
| 59-202635 | 11/1984 | Japan . |
| 4 361529 | 12/1992 | Japan . |
| 6 248767 | 4/1996 | Japan . |

Primary Examiner—Jey Tsai
Assistant Examiner—Joni Y. Chang
Attorney, Agent, or Firm—Oblon, Spivak, McClelland, Maier & Neustadt, P.C.

[57] ABSTRACT

A plasma processing apparatus comprises a processing container, a waveguide tube for guiding microwaves generated by a microwave generator, and a flat antenna member connected to the wave guide and disposed in the container to face a semiconductor wafer supported in the container. The antenna includes a plurality of short slits concentrically or spirally arranged in the antenna. The slits are spaced apart in the widthwise direction at intervals of 5% to 50% of a guide wavelength of the microwave, and each of the slits has a length of +30% of the guide wavelength centered with respect to half of the guide wavelength.

24 Claims, 15 Drawing Sheets

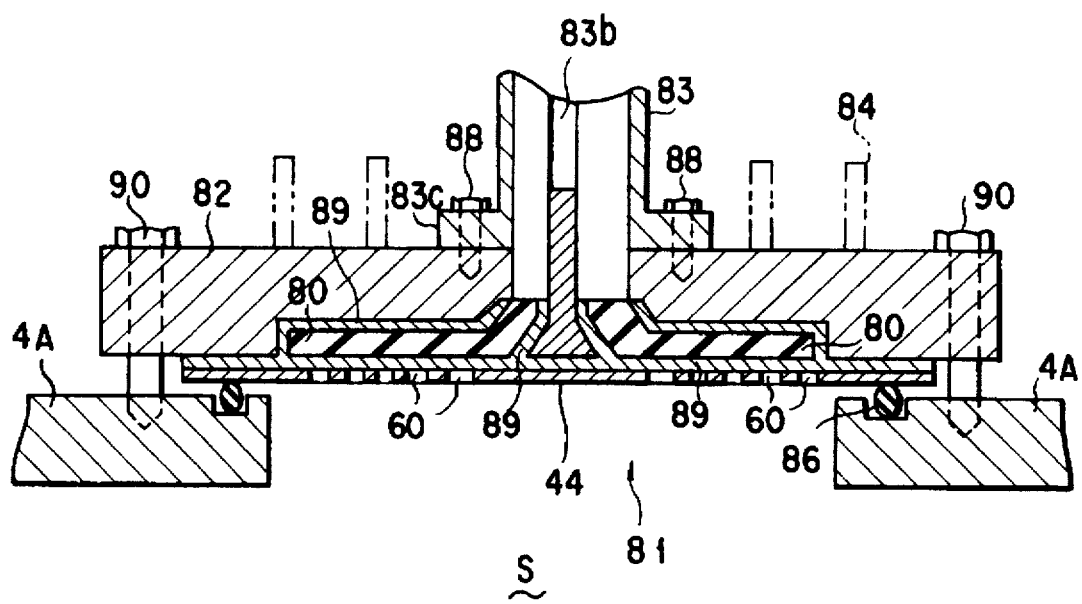
F I G. 15
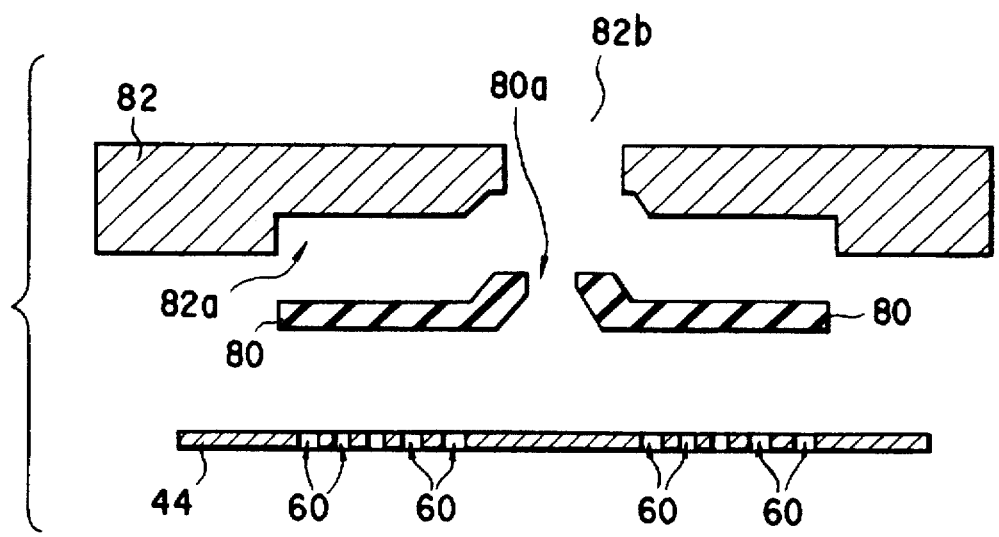
F I G. 16

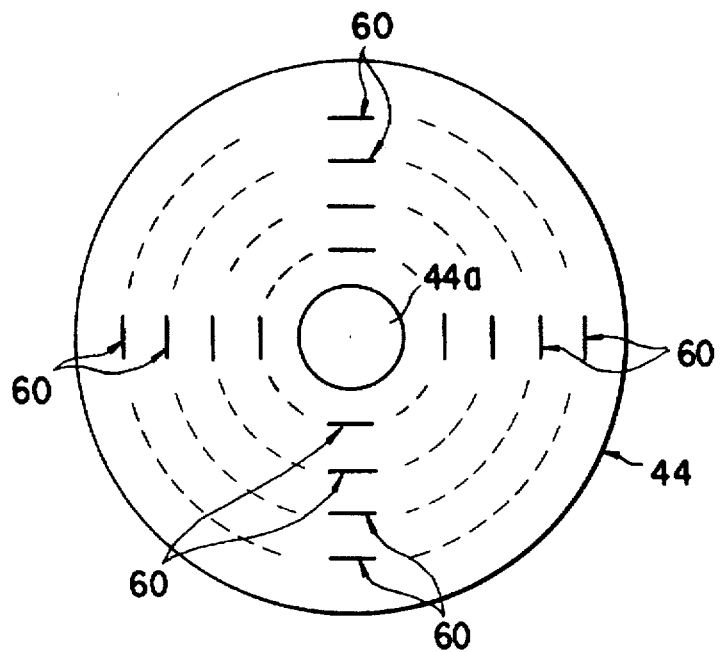
F I G. 17
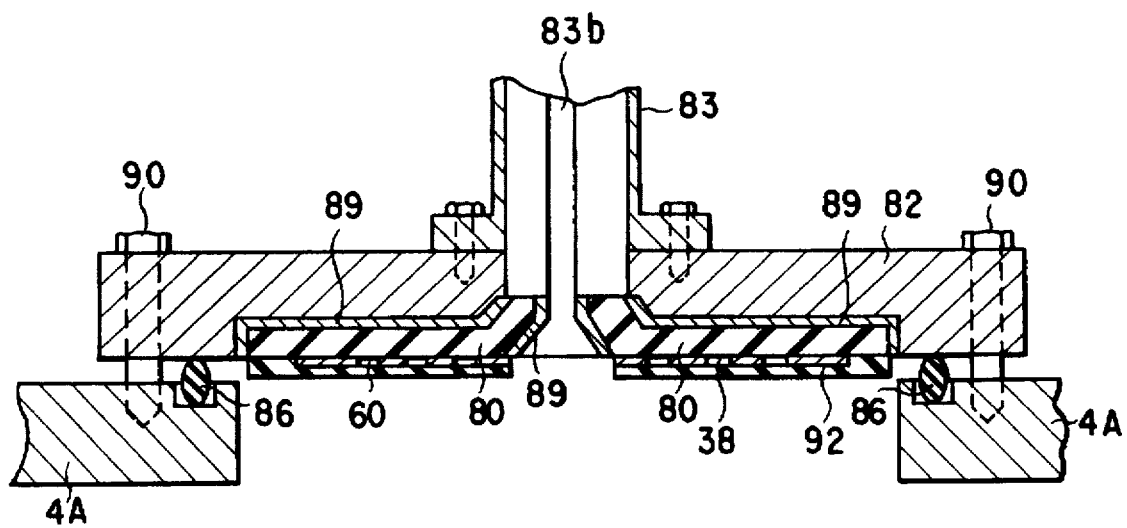
F I G. 18

PLASMA PROCESSING APPARATUS

BACKGROUND OF THE INVENTION

1. Field of the Invention

The present invention relates to a plasma processing apparatus which uses microwaves to generate plasma in a processing container thereof so as to use the generated plasma to process a subject to be processed.

2. Description of the Related Art

In recent years, the trends of raising the density and precision of semiconductor products result in plasma processing apparatuses being used generally in a process of manufacturing semiconductor products to perform film-forming, etching, ashing processes, etc. In particular, a microwave plasma processing apparatus, which combines a microwave and a magnetic field generated by a coil with each other to generate high density plasma, has been used because the microwave plasma apparatus is able to generate plasma even in a high vacuum state under a relatively low pressure condition of 0.1 mTorr to tens of mTorr.

Hitherto, as the microwave plasma apparatuses of the foregoing types, there have been known an apparatus (see Jap. Pat. Appln. KOKOKU Publication No. 58-13626) having a structure such that a microwave introduction port is provided for a plasma generating chamber having a magnetic field forming means to form electron cyclotron resonance to extract ions from the plasma generating chamber to irradiate semiconductor wafers in the reaction chamber with ion beams, and an apparatus (Jpn. Pat. Appln. KOKAI Publication No. 59-202635) comprising a discharge tube for generating plasma by introducing microwaves, wherein the discharge tube has a portion forward than the main discharge portion that is expanded in a direction from the position, at which the microwave is introduced, toward the sample.

However, since an apparatus of a type disclosed in Jap. Pat. Appln. KOKOKU Publication No. 58-13626 comprises a plasma generating chamber and a reaction chamber provided individually, the size of the apparatus cannot be reduced. As a result, the cost cannot be reduced and high voltage of about 1000 V is required to efficiently irradiate the wafer with ions generated from the plasma in the electric field.

An apparatus of the type disclosed in Jpn. Pat. Appln. KOKAI Publication No. 59-2026353 involves a magnetic flux generated by causing an electric current to flow in an annular coil being made to be perpendicular to the surface of the wafer but the same being inclined with respect to the same. Therefore, for example, the state of the etching process is undesirably inclined toward the direction of the magnetic flux. Thus, the wafer cannot be perpendicularly etched.

To overcome the foregoing problems, the inventors of the present invention have disclosed an apparatus in Jpn. Pat. Appln. KOKAI Publication No. 4-361529 which has a structure such that the distance from a surface, through which the microwave is introduced, to a surface on which the wafer is placed, is made to be as long as possible to form a cavity resonator structure for exciting electron cyclotron resonance. Thus, relatively small and high density plasma can be generated.

However, since the foregoing apparatus requires a magnetic field for generating plasma, a magnetic field generating means, such as a permanent magnet or an electromagnetic coil, must be provided. Therefore, the size of the apparatus is relatively large and the cost cannot be reduced.

In the case where the foregoing apparatus processes a wafer having a relatively small size, such as a 6-inch wafer, somewhat uniform plasma can be generated over the processing region. However, in the case where a large size wafer, such as an 8-inch wafer or a 12-inch wafer, which has been used recently is processed, the electric fields adjacent to the central portion and the peripheral portion of the wafer are undesirably intensified. As a result, the distribution of the whole electric field cannot easily be uniformed over the processing region. Thus, the electric field distribution is made to be non-uniform and the plasma process cannot easily be performed uniformly over the surface of the wafer.

Accordingly, the inventors of the present invention have suggested a plasma processing apparatus in the previous application (Jpn. Pat. Appln. No. 6-248767) which is capable of generating plasma by using only microwaves without using a magnetic field. The foregoing processing apparatus has a structure such that microwaves are supplied to a flat antenna member having a multiplicity of slits so arranged to generate electromagnetic waves to cause the inside portion of a processing container to be irradiated with electromagnetic waves from the antenna member; and the energy of the electromagnetic waves is used to dissociate the plasma forming gas to generate plasma.

The foregoing structure is able to form plasma having a somewhat high density by dissociating the gas due to the effect of the electromagnetic waves radiated from the antenna member. However, when greater electric power is intended to be supplied in order to obtain plasma having a higher density, satisfactorily great electric power cannot be supplied. Since the electric power that can be supplied is limited, it was confirmed that a density of plasma of, for example, $7 \times 10^{10}/cm^3$ or higher cannot be obtained. The reason for this is that as the electric power to be supplied is increased, the frequency of the plasma is raised, thus causing the density of the plasma to be raised. However, the dielectric constant of plasma in the case where no magnetic field is present tends to approach zero. Therefore, energy that can be supplied into the plasma is limited to a certain level. Thus, the radiated electromagnetic waves are reflected to the antenna member while maintaining the energy thereof.

SUMMARY OF THE INVENTION

An object of the present invention is to provide a plasma processing apparatus, the size of which can be reduced, and which is capable of generating low-pressure and high-density plasma.

As a result of energetic research and development of the mechanism for generating plasma, use of electromagnetic wave to supply electric power results in limitation in the quantity of electric power that can be supplied because the dielectric constant of the generated plasma gradually approximates zero as described above. However, a fact was found that slight change in the shapes of the slits of the antenna member and use of electrostatic fields exponentially decayed as the distance from the surface of the antenna is elongated in place of the electromagnetic waves to supply electric power enable the quantity of electric power that can be supplied to be significantly enlarged. In accordance with the foregoing knowledge, the present invention was found.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A and 2B are plan views showing antenna members for use in the processing apparatus shown in FIG. 1, in which FIG. 2A shows a structure in which slits are arranged along concentric lines, and FIG. 2B shows a structure in which slits are arranged along a spiral line;

FIG. 15 is a cross sectional view, which is a partially enlarged view of FIG. 14 and which shows a state where the antenna member is attached;

FIG. 16 is an exploded assembling view showing the portion for attaching the antenna member shown in FIG. 14;

FIG. 17 is a plan view showing a modification of the antenna member;

FIG. 18 is a diagram showing a portion in the vicinity of the antenna member in a case where a ceramic protective plate is provided for the antenna member of the apparatus shown in FIG. 14;

DETAILED DESCRIPTION OF THE PREFERRED EMBODIMENTS

An embodiment of a plasma processing apparatus according to the present invention will now be described in detail with reference to the drawings.

Figure 1:
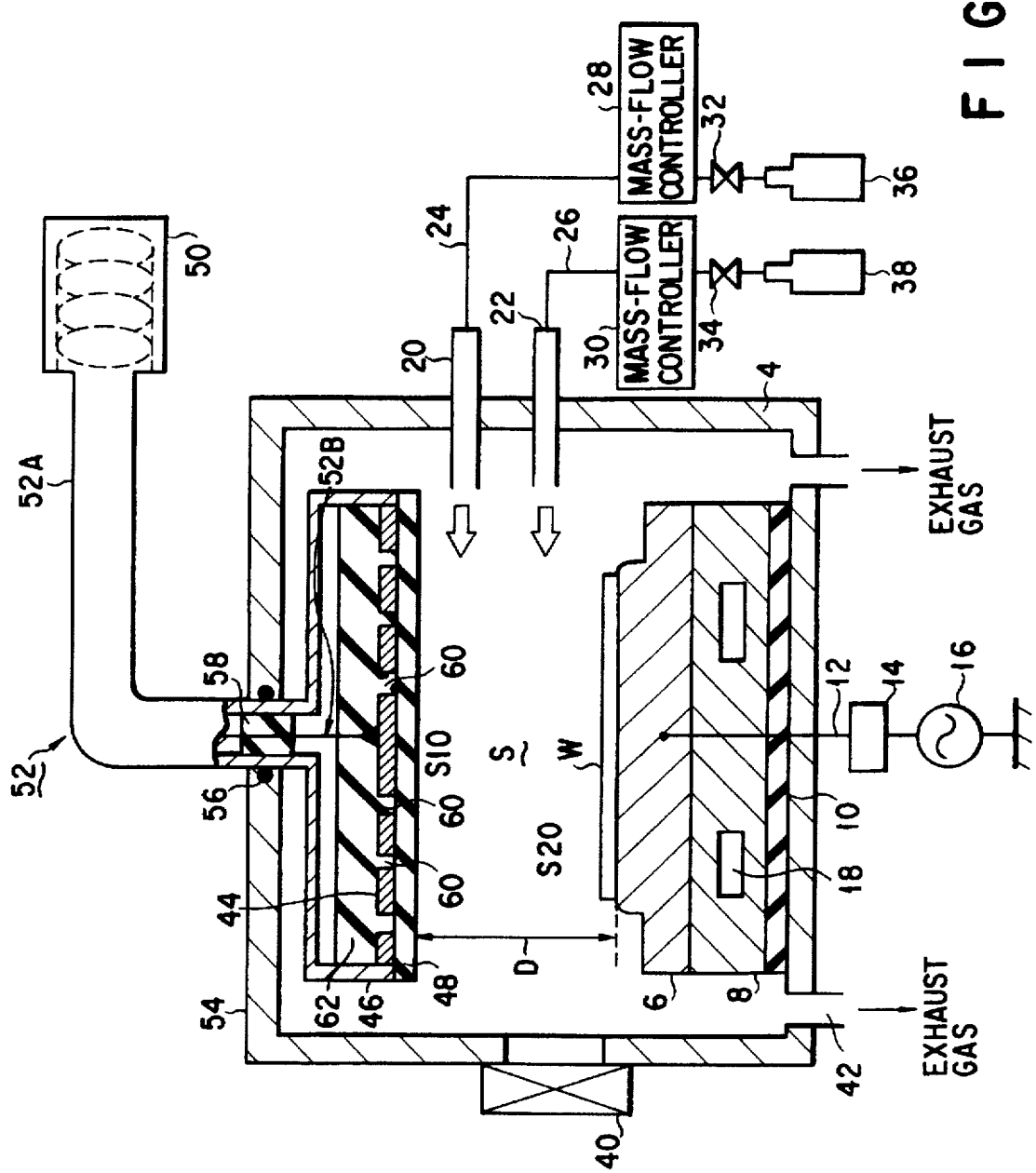
FIG. 1 is a schematic view showing a plasma processing apparatus according to a first embodiment of the present invention.

In this embodiment, description will be performed about a structure in which the plasma processing apparatus is applied to a plasma etching apparatus. As shown in FIG. 1, a plasma etching apparatus 2 serving as the plasma processing apparatus comprises a processing container 4 having a peripheral wall and a bottom portion, which are made of conductors, such as aluminum, the processing container 4 being formed into a cylindrical shape and including a sealed processing space S.

The processing container 4 accommodates a supporting frame 6 on which a member to be processed, for example, a semiconductor wafer W, is placed. The retainer frame 6 is made of, for example, aluminum subjected to an alumite process, the retainer frame 6 being formed into a substantially cylindrical shape having a top surface, the central portion of which is allowed to project and which is formed into a flat shape. The lower portion of the retainer frame 6 is supported by a support frame 8 similarly made of aluminum and formed into a cylindrical shape. The support frame 8 is disposed in the bottom portion in the processing container 4 through an insulating member 10. The retainer frame 6 has the upper surface having an electrostatic chuck and a clamping mechanism (not shown) for holding the wafer. The retainer frame 6 is, through a power supply line 12, connected to a matching box 14 and a, for example, 13.56 MHz, bias high-frequency power source 16. Although this embodiment employs the retainer frame for horizontally supporting the wafer thereon as means for supporting the wafer, there may be means for supporting the member to be processed in another state, for example, it may support the same substantially vertically.

The support frame 8 for supporting the retainer frame 6 is provided with a cooling jacket 18 therein through which cooling water for cooling the wafer is allowed to flow when the plasma processing is performed.

The peripheral wall of the processing container 4 is provided with a plasma-gas supply nozzle 20 made of quartz pipe for supplying plasma gas, for example, argon gas, and a processing-gas supply nozzle 22 made of, for example, quartz pipe for introducing a processing gas, for example, etching gas in such a manner that the plasma-gas supply nozzle 20 is placed at an upper position as illustrated. The foregoing nozzles 20 and 22 respectively are connected to a plasma-gas source 36 and a processing-gas source 38 respectively through mass-flow controllers 28 and 30 and on off valves 32 and 34 disposed on the gas supply passages 24 and 26. The etching gas for use as the processing gas may be $CF_3$ gas, $CHF_3$ gas, $CF_4$ gas, etc.

The peripheral side wall of the processing container 4 has an opening in a portion thereof, and a gate valve 40 capable of opening and closing the opening is disposed on the external surface of the pheripheral wall. The gate valve 40 is opened when the wafer is introduced or discharged to and from the processing container 4. During the process, the gate valve 40 is closed so that the inside portion of the processing container 4 is maintained to be vacuum.

The processing container 4 has, in the bottom portion thereof, exhaust ports 42 connected to a vacuum pump (not shown) so as to be capable of lowering the pressure in the processing container 4 to a predetermined level, if necessary.

In the upper portion of the processing container 4, there is disposed a flat antenna member 44, which is the characteristic of the present invention and generates an electrostatic field. Specifically, the flat antenna member 44 is formed to serve as a bottom plate of a radial waveguide box 46 formed into a small-height hollow cylindrical container. The flat antenna member 44 is suspended from the ceiling portion of the processing container 4 and disposed to confront and run parallel to the retainer frame 6 while having a predetermined distance from the retainer frame 6. The radial waveguide box 46 is made of conductive material, for example, aluminum, and having the surface subjected to an alumite process to improve the durability against plasma. An insulating protective plate 48 having a thickness of about, for example, 2 mm, and made of quartz glass or a thin ceramic plate is hermetically provided for the overall lower surface of the flat antenna member 44 to protect the flat antenna member 44 from plasma as well as maintaining the airtightness in the radial waveguide box 46.

An end of an external pipe 52A of a waveguide pipe 52 having another end connected to, for example, a 2.45 GHz, microwave generator 50 is extended into the container 4 and is connected to the central portion of the upper wall of the disc-like radial waveguide box 46. An internal cable 52B of the waveguide pipe 52 is connected to the central portion of the disc-like antenna member 44 or held slightly apart from the foregoing central portion. The structure in which the internal cable 52B is connected is employed in the illustrated case. As the waveguide pipe 52, a waveguide pipe having a circular or a rectangular cross sectional shape or a coaxial waveguide pipe may be employed. In this embodiment, the coaxial waveguide pipe is employed. A sealing member 56, such as an O-ring, is interposed in a portion in which the waveguide pipe 52 penetrates the ceiling portion 54 of the processing container 4 so as to maintain the airtightness. Moreover, a sealing member 58, for example, a ceramic seal, is airtightly disposed in the waveguide pipe 52 by brazing or the like in a portion in which the waveguide pipe 52 and the radial waveguide box 46 are connected to each other so as to maintain the vacuum state in the radial waveguide box 46.

Figure 2A:
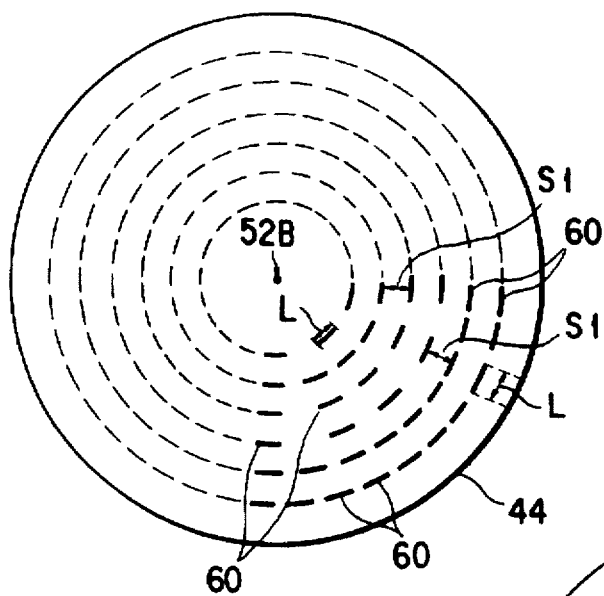
Figure 2B:
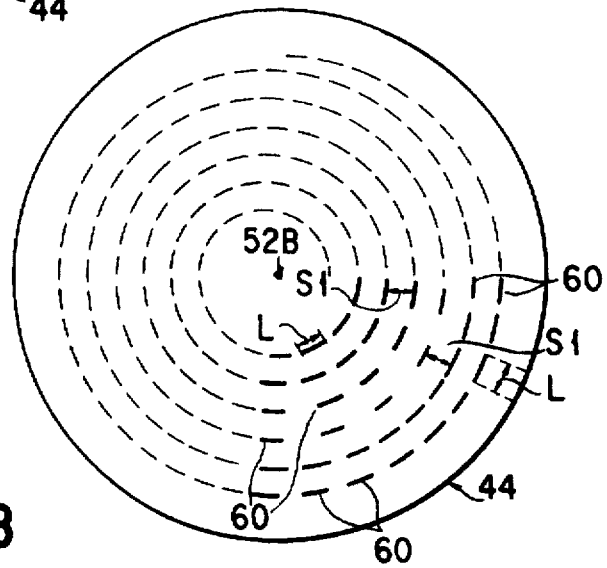

The disc-like antenna member 44 comprises, for example, a conductive disc, for example, a copper plate having a diameter of 50 cm and a thickness of 1 mm or smaller. As clearly shown in FIGS. 2A and 2B, the copper plate has a multiplicity of slits 60 on a multiplicity of loops, the diameters of which gradually increase in a direction from the center of the conductive disc to the outer periphery of the same such that the slits 60 starts at a position somewhat outwardly apart from the central portion of the conductive disc, for example, several cm apart from the central portion and the slits 60 extend along loop while the slits 60 being disposed at predetermined intervals in the lengthwise direction and the widthwise direction. The foregoing loops are in the form of a multiplicity of concentric circle lines (see FIG. 2A), the diameters of which are gradually enlarged in a direction from the center to the outer periphery or a spiral line (see FIG. 2B) formed from the center to the outer periphery.

In this embodiment, length L of each slit is set to be about half of the guide wavelength of the microwave generated by the microwave generator 50 and the width of the same is set to be about 1 mm. Also distance S1 between adjacent slits 60 in the radial direction of the flat antenna members 44 is set to be shorter than the foregoing guide wavelength of the microwave and, for example, a distance of 5% to 50% of the guide wavelength. The slit group is formed on substantially the overall surface of the antenna member 44 in such a manner that the foregoing conditions are satisfied.

The allowable length L of each slit 60 is smaller than the guide wavelength $\lambda$, preferably about ±30% of the guide wavelength centered with respect to half of the guide wavelength. If the length L of the slit 60 is too short, only local electrostatic fields are formed. If the length L is the same as or longer than the guide wavelength, the efficiency in generating static electricity deteriorates undesirably. In consideration of the foregoing facts, it is preferable that the length L be half of the guide wavelength. If the length is longer than the foregoing value or shorter than the same, the efficiency deteriorates.

If distance S1 between adjacent slits in the radial direction of the antenna member 44 is the same as or longer than the guide wavelength of the microwave, electromagnetic waves are undesirably oscillated from the flat surface of the antenna member 44 (that is, electromagnetic waves are undesirably oscillated in the same direction as the direction in which the electrostatic fields are generated). If the distance S1 is set to be substantially half of the guide wavelength, the phases of the electrostatic fields generated by the respective slits are made to be opposite satisfactorily.

By strictly limiting the length L of the slit and the distance S1 between adjacent slits as described above, when microwaves are applied to the antenna member 44, a result different from the technology applied by the inventor of the present invention in which the electromagnetic waves are discharged into the processing space being realized in that an electrostatic field, which exponentially attenuate as the distance is made to be longer from the surface of the antenna, can be formed in the processing space. Therefore, the density of plasma is raised as the supplied electric power is increased. Thus, even if the dielectric constant approximates zero, further supply of electric power is enabled.

Figure 3:
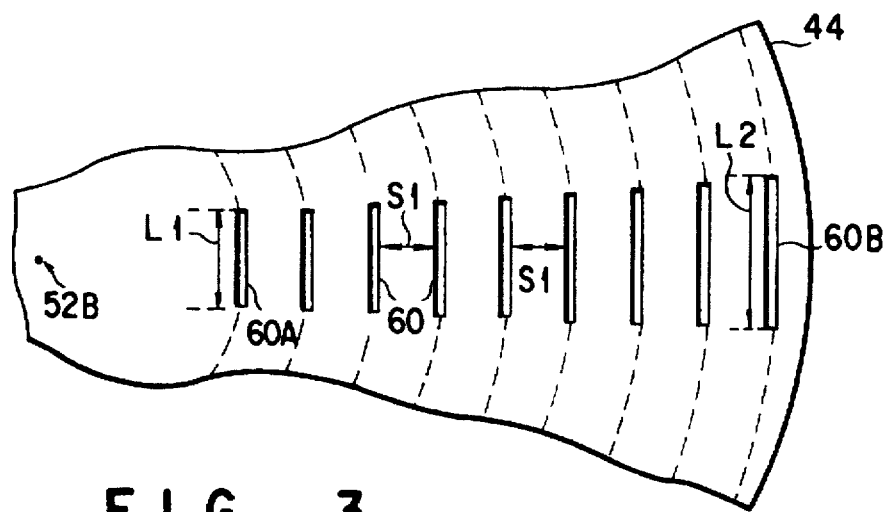
FIG. 3 is an enlarged plan view showing the antenna member shown in FIG. 2A.

In the foregoing case, although the lengths L of the slits 60 formed on the entire surface of the antenna member 44 may be made to be the same so as to uniform the horizontal-directional intensities of the electric field which is formed just below the antenna member 44 and which is exponentially decreased, the lengths of the slits may be made to be different slightly within the allowable range between those in the central portion of the antenna member 44 and those in the peripheral portion in order to partially deviate the intensity of the electrostatic field to be formed. For example, the lengths of the slits may be gradually and slightly elongated in the radial direction from the central portion of the antenna member 44 toward the outside of the same, as shown in FIG. 3, which is an enlarged view. For example, length L1 of an innermost slit 60A may be set to be about ½-to ⅒λ (where λ is the guide wavelength of the microwave) and length L2 of the outermost slit 60B may be set to be about less than 1λ-to ⅒λ. As a result, strong electrostatic fields can be formed in the peripheral portion as compared with those formed in the central portion. Note that alignment slits (longer than other slits) may be formed on the outside of the slits and in the outermost portion of the antenna member 44 for the purpose of substantially perfectly converting the microwave, transmitted to the foregoing portion, into the electrostatic fields for the purpose of improving the efficiency of the antenna.

On the other hand, the radial waveguide box 46 accommodates a dielectric material or member 62 having a predetermined dielectric constant for shortening the wavelength of the microwaves to be supplied to the antenna member to make the wavelength to be the guide wavelength having a short wavelength, the dielectric material 62 being accommodated in such a manner that the dielectric material 62 is in contact with the overall upper surface of the antenna member 44. It is preferable that the dielectric material 62 be made of material exhibiting a small dissipation loss, such as $Al_2O_3$ or SiN. Distance D from the lower surface of the antenna member 44 to the upper retaining surface of the retainer frame 6 is set to be a relatively long distance of, for example, about 5 cm to 7 cm. Thus, the processing space S is substantially divided into a plasma forming region S10 and a processing region S20 in which the process is actually performed by using activating species obtainable from the plasma diffused in the foregoing space.

The operation of this embodiment having the foregoing structure will now be described.

Initially, the gate valve 40 is opened to place the semiconductor wafer W on lifter pins (not shown) in the processing container 4 by a conveying-arm (not shown). Then, the lifter pins are moved downwards so that the wafer W is placed on the vacuum chuck on the upper surface of the retainer frame 6 so as to be adsorbed.

Then, the pressure in the processing container 4 is maintained at a predetermined processing pressure, for example, a level within a range from, for example, 0.1 mTorr to tens of mTorr to supply argon gas from the plasma-gas supply nozzle 20 in such a manner that the flow rate is controlled. Simultaneously, etching gas, for example, $CF_4$ gas, is supplied from the processing-gas supply nozzle 22 in such a manner that the flow rate is controlled. Simultaneously, microwaves are supplied from the microwave generator 50 through the waveguide pipe 52 to the antenna member 44 so that electrostatic fields are formed in the processing space S, that is, in the plasma forming region, the electrostatic field being exponentially (not linearly proportional) attenuated as the distance from the surface of the antenna is increased, causing plasma to be generated to perform the etching process.

Microwaves of, for example, 2.45 GHz generated in the microwave generator 50 are transmitted through the coaxial waveguide pipe 52 to reach the antenna member 44 in the radial waveguide box 46. During transmission of the microwaves from the central portion of the disc-shape antenna member 44, to which the internal cable 52B is connected, toward the peripheral portion, electrostatic fields are generated among the multiplicity of the slits 60 formed concentrically in the antenna member 44. Therefore, the resultant entire electrostatic field exponentially attenuating as the distance from the surface of the antenna is increased is formed in an upper portion of the processing space S just below the antenna member 44, specifically, in the plasma forming region S10.

The argon gas excited by the electrostatic field is formed into plasma which is diffused into the processing region S20 in which the diffused plasma activates the processing gas to produce activating species. The operations of the activating species are used to subject the surface of the wafer W to a process, for etching.

Since the length L of the slit 60 and the radial directional distance S1 between adjacent slits 60 of the antenna member 44 are limited in the present invention, electromagnetic wave does not substantially emitted from the antenna member 44 toward the processing space. In the foregoing processing space, only the electrostatic field exponentially attenuating as the distance from the surface of the antenna is increased is generated. In the case of the foregoing technology applied previously and having the structure such that electromagnetic waves are discharged, if the density of plasma is raised as the electric power is supplied, its vibration frequency is raised and, therefore, the dielectric constant is made to be substantially zero. Thus, electric power cannot further be supplied, thus causing the density of plasma to encounter the foregoing limit. However, the structure of the present invention in which the supply of electric power is performed by using the electrostatic fields is able to eliminate the foregoing upper limit. Thus, electric power can efficiently be supplied, thus enabling electric power to be supplied by a larger quantity.

Therefore, the density of plasma can be raised as the quantity of electric power to be supplied is enlarged. Moreover, high density plasma can stably be formed over the entire surface of the plasma forming region S10 formed below the antenna member 44.

When electric power in the form of electromagnetic wave is supplied with the slit shape previously suggested by the inventor of the present invention, the highest density of plasma is about $7 \times 10^{10}/cm^3$ and, therefore, cutting off takes place. Thus, further dense plasma cannot be formed. However, the present invention having the structure such that the electric power is supplied by using the electrostatic fields enables electric power of 1300 KW to 3000 KW to be supplied. As a result, the density of plasma can be raised to about $1 \times 10^{12}/cm^3$, which is a satisfactory result.

Figure 4:
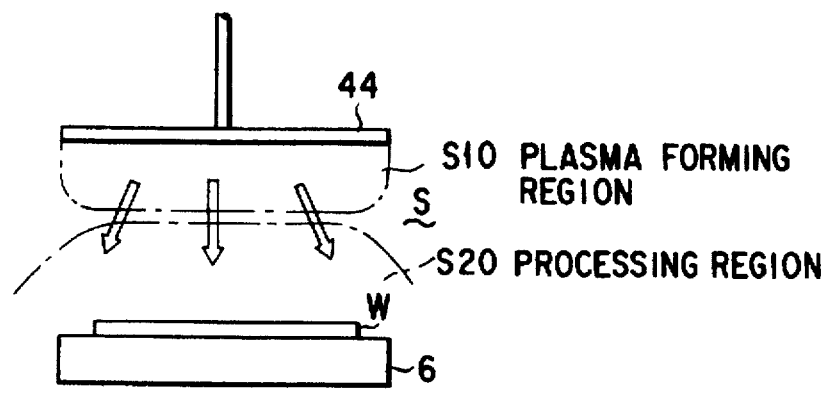
FIG. 4 is a schematic view showing a plasma forming region and a processing region in a processing space.
Figure 5:
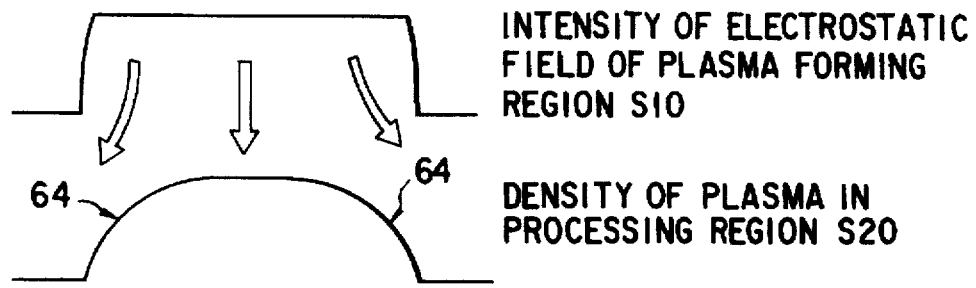
FIG. 5 shows density of plasma in a processing region in a case where the intensity of the electrostatic field in the plasma forming region is uniform.

In the apparatus having the structure in which the processing space S can be divided into the plasma forming region S10 and the processing region S20 formed below the plasma forming region S10, plasma or dissociation gas formed in the plasma forming region S10 diffuses into the processing region S20 formed below the plasma forming region S10, as shown in FIG. 4. Thus, activating species for the processing gas are formed. Therefore, when the intensity of the electrostatic field is made to be uniform over the surface of the wafer in the plasma forming region S10 as shown in FIG. 5, the formed plasma diffuses as described above and flows downwards. Therefore, the density of plasma (equivalent to the density of activating species) in the processing region S20 is lowered in a peripheral portion 64, thus causing sagging to take place. In the foregoing case, the overall surface of the wafer cannot sometimes be processed.

Accordingly, the lengths L of the slits 60 are sequentially elongated from the central portion of the antenna member 44 to the peripheral portion, as shown in FIG. 3. Thus, the electrostatic field in the peripheral portion just below the antenna member 44 can be intensified as compared with that in the central portion of the same.

Figure 6:
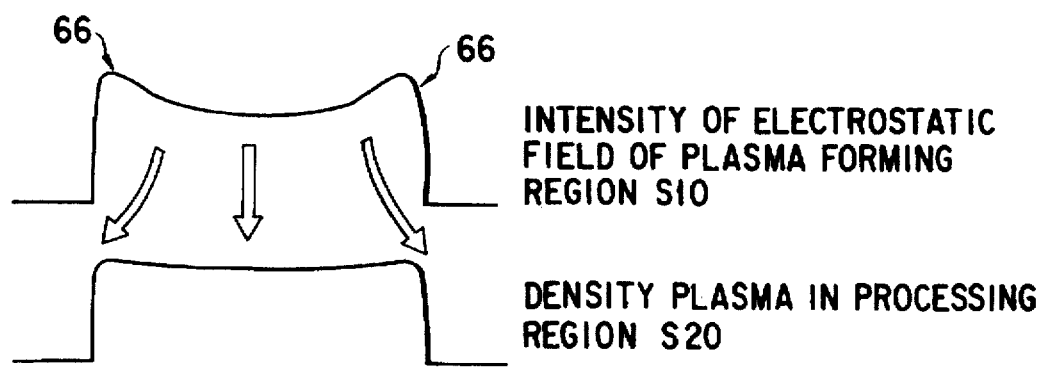
FIG. 6 shows density of plasma in a processing region in a case where the electrostatic field in the peripheral portion of the plasma forming region is intensified.

The foregoing state is shown in FIG. 6 in which the intensity of the electrostatic field in the plasma forming region S10 is made such that the intensity in the peripheral portion 66 is slightly greater than that in the central portion. Thus, sagging in the shoulder portion (the peripheral portion) of the processing region S20 formed below the plasma forming region S10 can be prevented. Thus, plasma (activating species) capable of compensating the previous sagging and exhibiting uniform density over the entire surface of the processing region S20 and high density can stably be generated.

Although the foregoing embodiment has been described about the apparatus having the structure such that the height (the distance from the antenna member, precisely, from the lower surface of the quartz glass 48 and the upper surface of the retainer frame 6) of the processing space S is large to enable two vertical regions to be formed which have two different functions, the present invention is not limited to the apparatus of the foregoing type. The present invention may be applied to an apparatus of a type in which the distance from the antenna member to the retainer frame is short and thus the plasma forming region and the processing region are integrally formed.

An example of a specific shape of the flat antenna member for use in the apparatus according to the present invention will now be described with reference to FIGS. 7 to 10.

FIGS. 7 to 10 are plan views showing flat antenna members according to modifications 1 to 4. The flat antenna member has, on the outermost portion thereof, alignment slits 100 for substantially perfectly converting transmitted microwaves into electrostatic fields so that reflected waves are eliminated in the periphery of the antenna member and, thus, the efficiency of the antenna is improved. The frequency of the microwave is a high frequency of 2.45 GHz and the guide wavelength is set to be about 40 mm in consideration of the dielectric constant of the ceramics. The parameters of each antenna member are shown in Table 1.

TABLE 1

Figure 7:
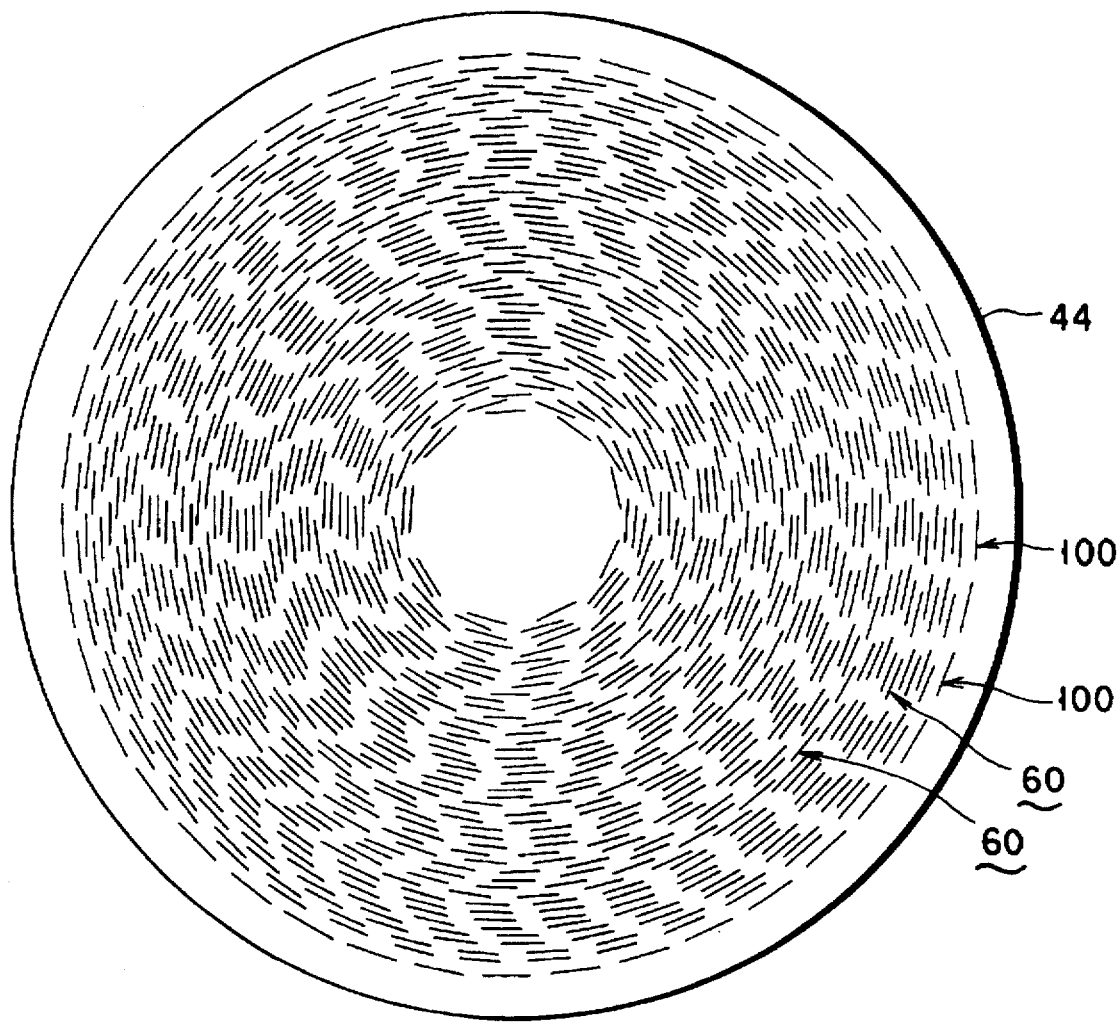
FIG. 7 is a plan view showing a flat antenna member according to Modification 1.
Figure 8:
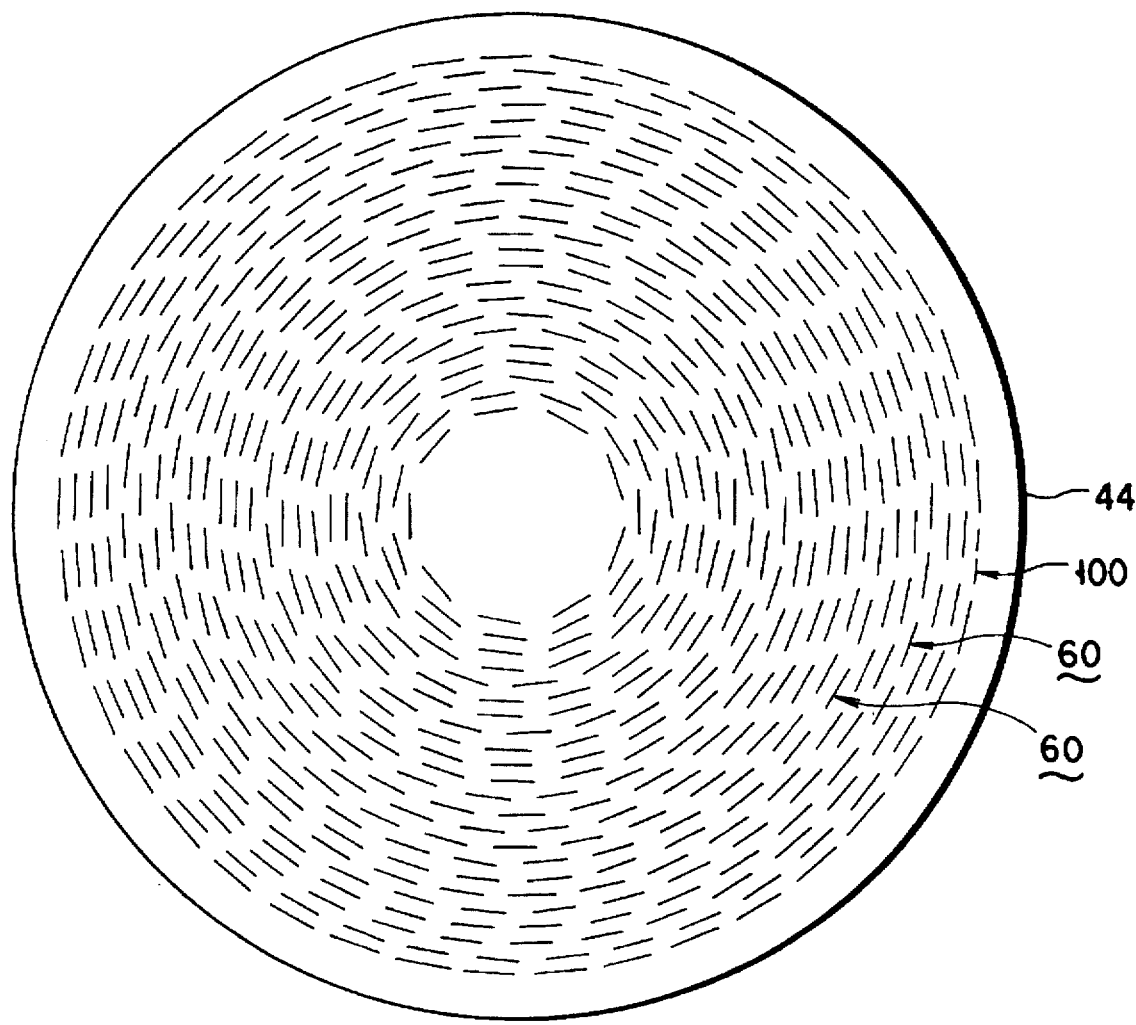
FIG. 8 is a plan view showing a flat antenna member according to Modification 2.
Figure 9:
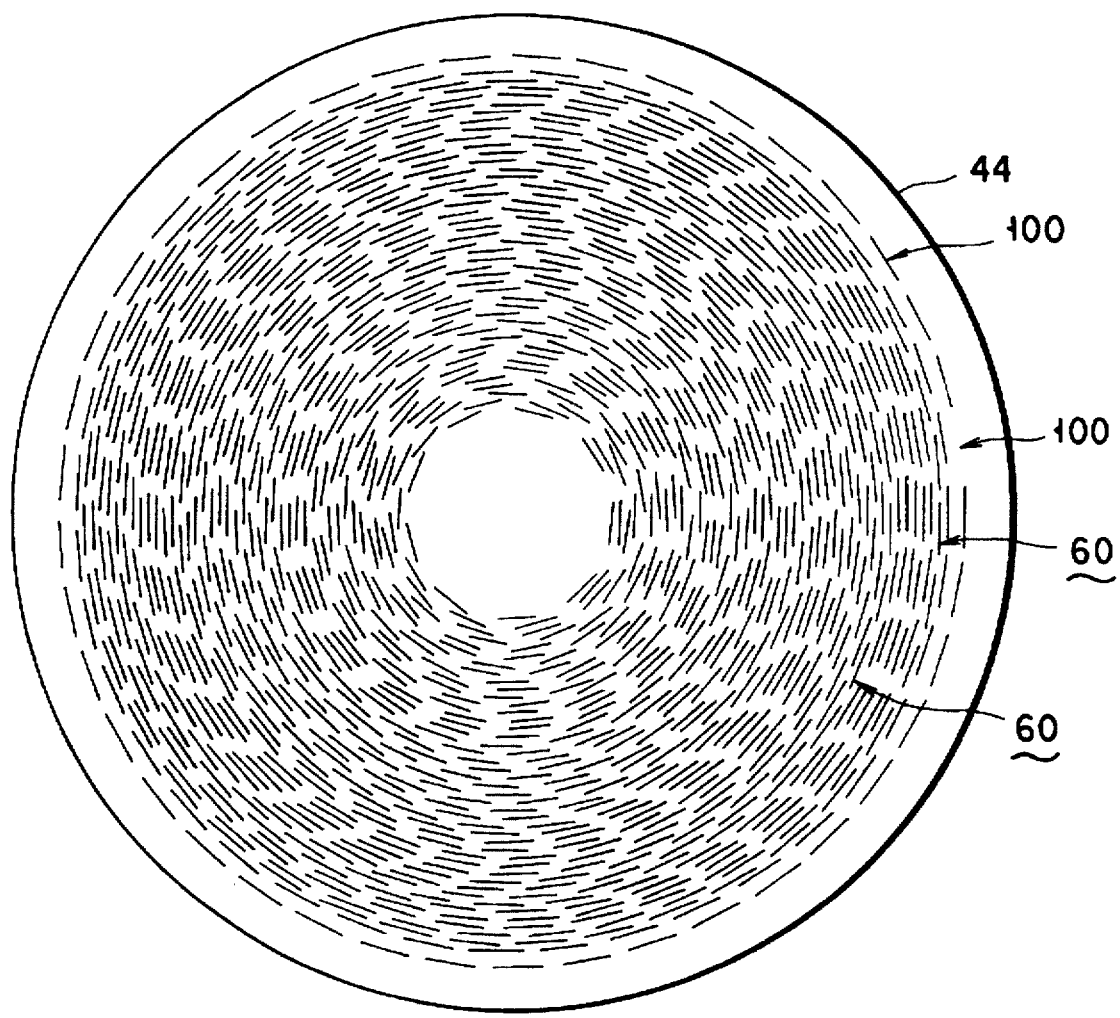
FIG. 9 is a plan view showing a flat antenna member according to Modification 3.
Figure 10:
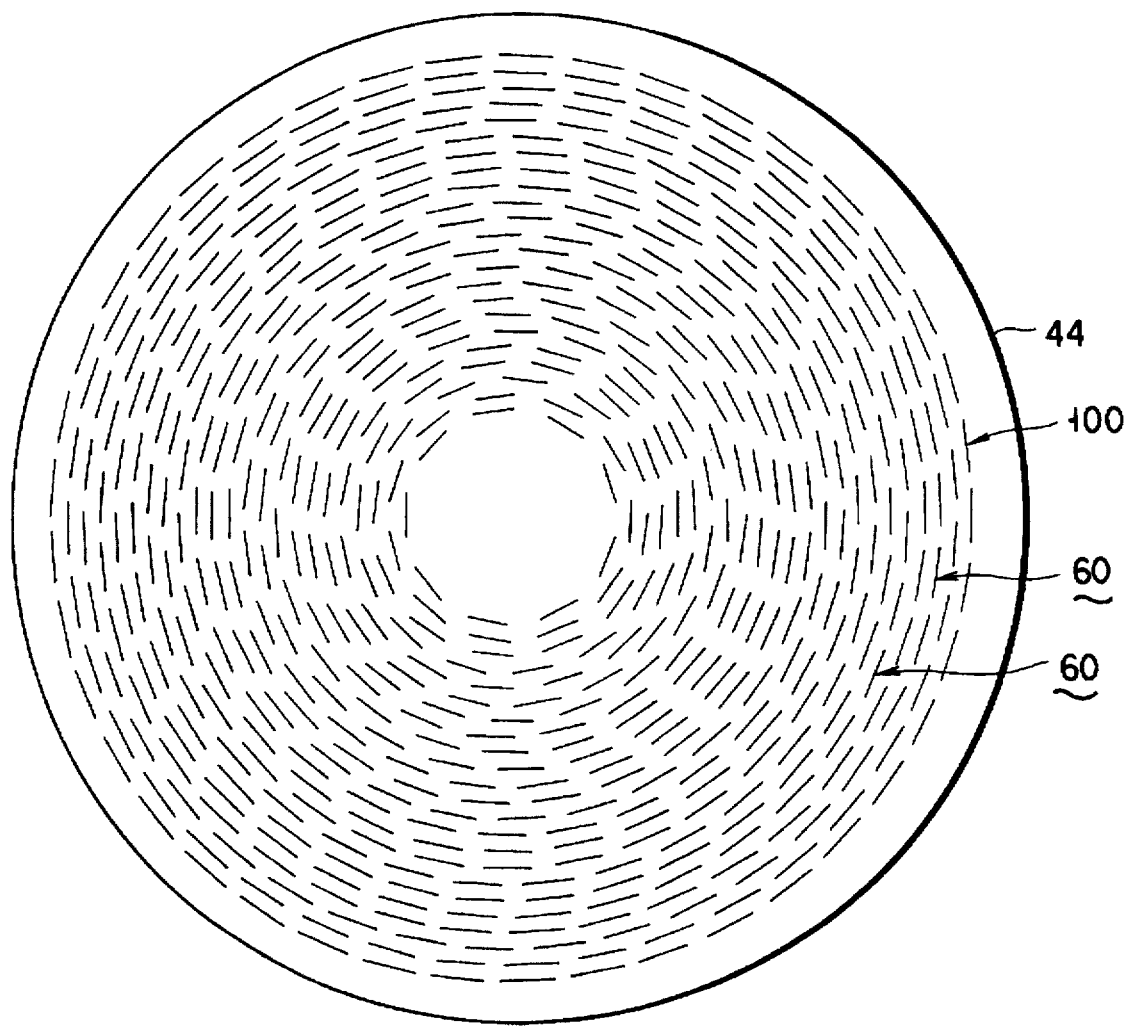
FIG. 10 is a plan view showing a flat antenna member according to Modification 4.

| Flat Antenna Member | Modification 1 | Modification 2 | Modification 3 | Modification 4 |
|---|---|---|---|---|
| Dielectric Constant of Alumina | 9.6 | 9.6 | 9.6 | 9.6 |
| Rmax[mm] | 250 | 250 | 250 | 250 |
| Rmin[mm] | 52.8 | 52.8 | 52.0 | 52.0 |
| Width of Slit [mm] | 2.0 | 2.0 | 2.0 | 2.0 |
| Alignment Slits | Provided | Provided | Provided | Provided |
| Length of Alignment Slits [mm] | 29.8 | 29.8 | 29.8 | 29.8 |
| Length of Slits Except Alignment Slits [mm] | 25.0 | 25.0 | 29.5 to 23.2 | 29.5 to 23.2 |
| Interval of Slits Except Alignment Slits [mm] | 4.0 | 8.0 | 4.0 | 8.0 |
| Number of Slits | 1097 | 581 | 1090 | 578 | where the antenna member according to Modification 1 is shown in FIG. 7, the antenna member according to Modification 2 is shown in FIG. 8, the antenna member according to Modification 3 is shown in FIG. 9 and the antenna member according to Modification 4 is shown in FIG. 10, Rmax is the diameter of a circumference on which the plural outermost slits are formed, and Rmin is the diameter of the circumference on which the plural innermost slits are formed. The Modifications 3 and 4 have the structure such that the length of the alignment slits is 29.5 mm to 23.2 mm. The foregoing fact shows that the lengths of the slits are, in the foregoing range, elongated gradually in the radial direction as described above.

Note the foregoing parameters are shown as examples and therefore the present invention is not limited to the foregoing values.

The structure according to the first embodiment is arranged such that circular-arc shape slits are concentrically or spirally disposed so as to be formed into a radial structure, the coaxial waveguide tube is used so as to supply microwaves to the center of the disc-like antenna member 44, and energy is discharged when the microwave is outwardly transmitted from the center in the radial direction. The present invention is not limited to the foregoing structure. For example, each slit may be formed into a straight shape. The intervals of the slits in the radial direction may be varied in place of the regular intervals.

Figure 11:
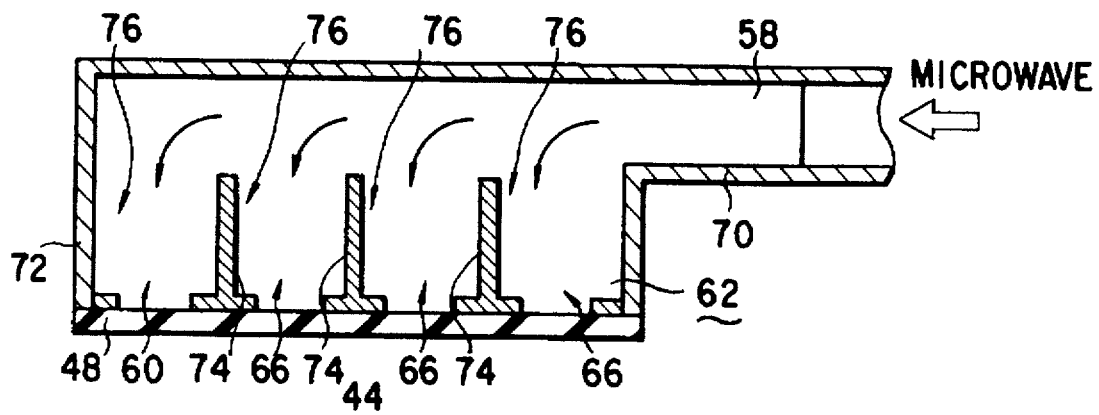
FIG. 11 is a schematic view showing an antenna member of a plasma processing apparatus according to a second embodiment of the present invention.
Figure 12:
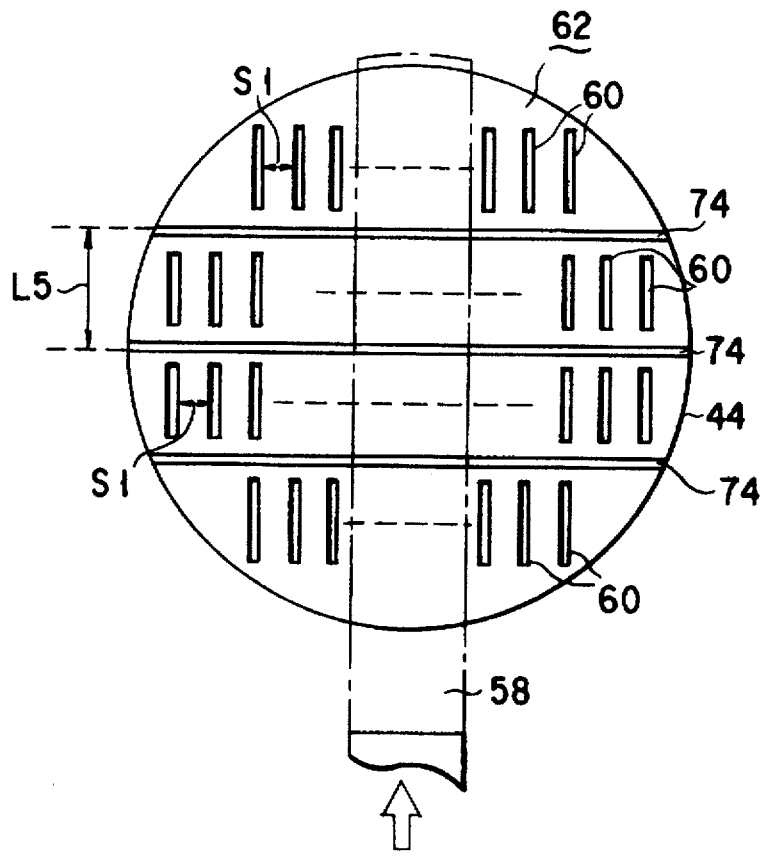
FIG. 12 is a plan view showing the antenna member shown in FIG. 11.
Figure 13:
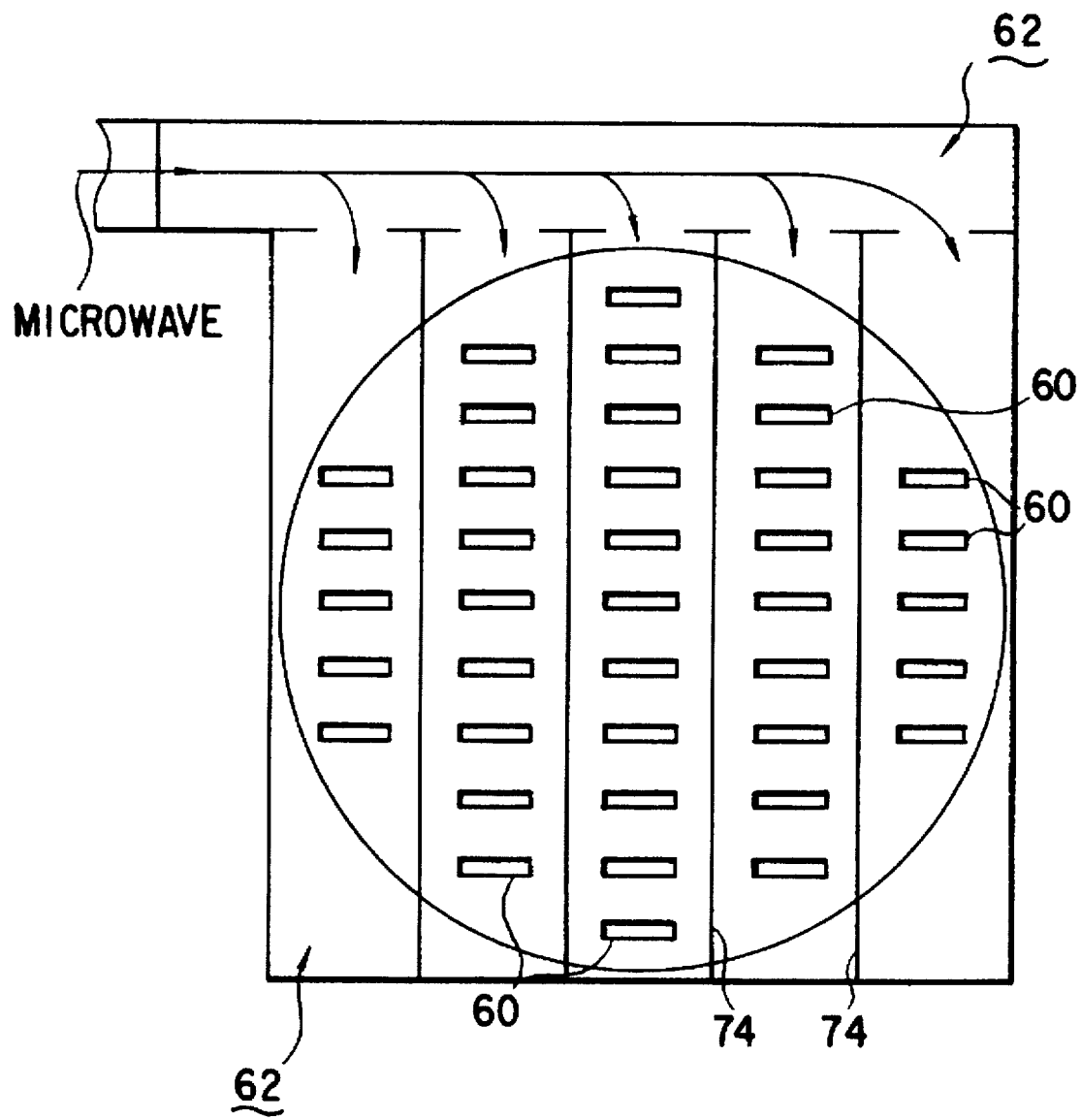
FIG. 13 is a schematic plan view showing a state where microwaves are introduced.

Referring to FIGS. 11 to 13, a plasma processing apparatus according to a second embodiment of the present invention will now be described. In this embodiment, only a portion in the vicinity of the antenna member is described and the other portions, which are substantially the same as those according to the first embodiment, are omitted from description.

As shown in FIGS. 11 to 13, the second embodiment comprises a usual rectangular waveguide tube 70 in place of the coaxial waveguide tube to transmit microwaves. Moreover, plural, which is three in the drawings for the purpose of simplifying the description and the drawings, copper partition walls 74 are stood erect from the surface of a disc-like antenna member 44 to be accommodated in a waveguide box 72, the partition walls 74 being made of copper, which is the same as the material of the antenna member 44, and stood erect in a direction perpendicular to the lengthwise direction of the rectangular waveguide tube 70 so as to be disposed in the same intervals. As a result, the portion in the waveguide box 72 is divided into four sections along a direction in which the microwave propagates. Thus, a plurality of, that is, four branched waveguide tubes 76, having top ends allowed to communicate with the rectangular waveguide tube 70, are formed.

The antenna members corresponding to the branched waveguide tubes 76 sectioned by the partition walls 74 have a multiplicity of slits 60 running parallel to one another. The length L of each slit and the distance S1 between adjacent slits are the same as those according to the first embodiment. That is, the length L of each slit is made to be shorter than the guide wavelength of the microwave, for example, about half of the guide wavelength. Also the distance S1 between slits is made to be shorter than the guide wavelength of the microwave, for example, about half of the guide wavelength.

Distance L5 between two adjacent partition walls 74 is made to be half or longer than guide wavelength λ g of the microwave as well as not longer than the guide wavelength as indicated by the following equation so as to prevent generation of high-order mode electrostatic field:

$$\tfrac{1}{2}\lambda g \leq L5 \leq \lambda g$$

Although the illustrated example has only three branched waveguide tubes 76 to simplify the description, a multiplicity of branched waveguide tubes 76 are formed in actual. Although the illustrated slits in each of the branched waveguide tubes 76 are in the form of one line, the slits may be formed into plural lines. The necessity of forming the slits in parallel to one another can be eliminated. Moreover, the necessity of making the intervals among the slits to be the same can be eliminated. In addition, the slits 60 are required not to run parallel to the partition walls 74. Therefore, the necessity of forming the slits 60 perpendicular to the partition walls 74 can be eliminated.

The structure such that the inside portion of the waveguide tube is enclosed with the ceramic material 62 and the sealing member 58 made of the ceramic material is airtightly interposed at an intermediate position in the rectangular waveguide tube 70 to maintain the vacuum state in the waveguide box 72 is the same as the structure according to the first embodiment. The ceramic material 62 serving as the dielectric material also serves as a vacuum maintaining shield.

Although the antenna member according to this embodiment is formed into the disc-like shape, the antenna member may be formed into a tetragon, such as a rectangle or a square which covers the overall upper portion of the processing space.

Also the second embodiment attains similar operations and effects to those obtainable from the first embodiment. That is, microwaves transmitted through the rectangular waveguide tube 70, are sequentially introduced into each of the branched waveguide tubes 76 as indicated by arrows. Thus, supplied electric power is, as the electrostatic fields exponentially attanuating as the distance from the surface of the antenna is increased, supplied from the slit group to the processing space for each branched waveguide tubes 76. As a result, electromagnetic waves are not oscillated into the processing space.

Therefore, in a manner different from the technology applied previously in which electromagnetic waves are discharged, even if the supply of electric power raises the density of plasma and causes the dielectric constant to approximate zero, electric power can further be supplied.

Figure 14:
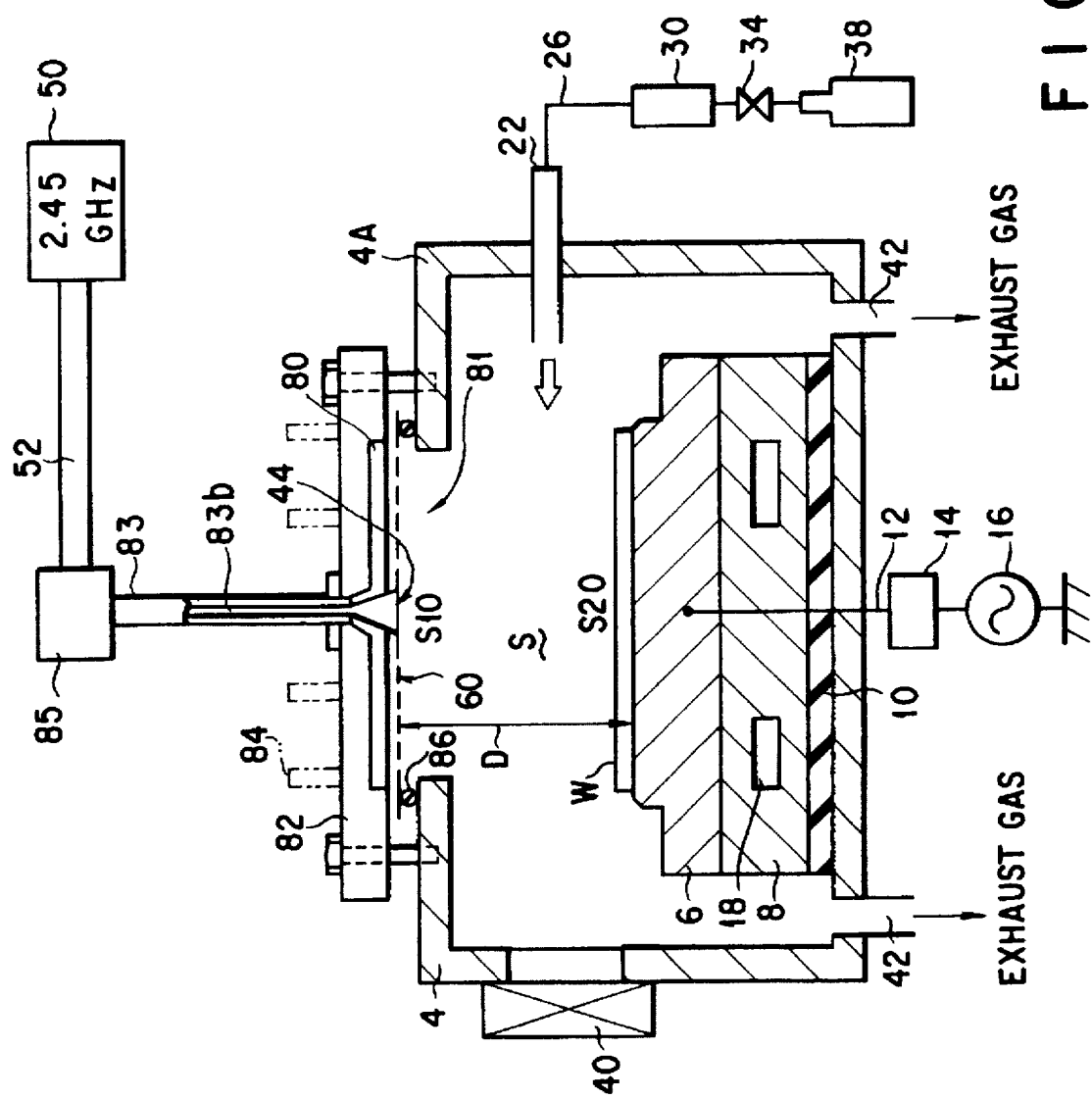
FIG. 14 is a schematic view showing the overall body of a plasma processing apparatus according to a third embodiment of the present invention.

A third embodiment of a plasma processing apparatus according to the present invention will now be described with reference to FIGS. 14 to 16. Elements substantially the same as those according to the foregoing embodiments are given the same reference numerals and the same elements are omitted from the description to be performed below.

In this embodiment, the peripheral wall of the processing container 4 has a processing gas supply nozzle 22 comprising a quartz pipe for introducing, for example, etching gas, into the processing container 4, the process-gas supply nozzle 22 being connected to the processing-gas source 38.

The etching gas for use as the processing gas may be $CF_3$, $CHF_3$, $CF_4$ or $C_4F_8$ gas or mixed gas with any one of the foregoing gases and hydrogen gas. Note that inert gas, such as argon gas, may be mixed with the foregoing gas. The nozzle for the foregoing plasma gas may be provided similar to the foregoing embodiment.

The ceiling portion of the processing container 4 has a microwave introduction port 81 arranged to introduce microwaves into the processing container 4 and having size substantially the same as the diameter of the retainer frame 6. A flat antenna member 44 is disposed at the microwave introduction port 81, the antenna member 44 being arranged to form an electrostatic field in the processing space S, described in the previous embodiment and being the characteristic of the present invention. The upper portion of the antenna member 44 is, through a dielectric material 80 for shortening the guide wavelength of the microwave, fully covered with an antenna covering member 82 made of excellent heat conductor, for example, aluminum. The antenna covering member 82 has the upper surface exposed to the atmosphere and serving as the heat discharge surface. The dielectric material 80 is formed into a disc-like shape made of, for example alumina ceramic and having a large thickness. The dielectric material 80 has, in the central portion thereof, an insertion opening 80a (see FIG. 16) through which a conductor line for transmitting microwaves is penetrated. The dielectric material 80 has size capable of covering at least the area of the antenna member 44 in which the slits 60 are formed for the purpose of shortening the guide wavelength of the microwaves, the dielectric material 80 being accommodated in a dielectric-material accommodation portion 82a formed in the lower portion of the antenna covering member 82 and having a circular recess. The dielectric material 80 may be made of, as well as alumina, SiN, AlN or the like which exhibits a small dielectric loss. Moreover, an insertion opening 82b, through which the conductor line for transmitting microwave is penetrated, is formed in the central portion of the antenna covering member 82. The microwave generator 50 for generating, for example, 2.45 GHz microwaves, initially transmits microwaves through the waveguide pipe 52. At an intermediate moment, the transmission method is converted by a converter 85 so that microwaves are transmitted to the antenna covering member 82 through a coaxial waveguide pipe 83. Note that a multiplicity of cooling fins 84 may be, as indicated by imaginary lines, disposed on the upper surface of the antenna covering member 82 for the purpose of improving the cooling efficiency. Furthermore, or as an alternative to this, cooling fans (not shown) may be disposed adjacent to the antenna covering member 82 to perform forcible air cooling. In addition to the foregoing cooling means, a cooling jacket (not shown) may be provided for the antenna covering member 82 to further improve the cooling efficiency. As shown in FIGS. 15 and 16, a leading flange portion 83c of the coaxial waveguide pipe 83 which is tubular external conductor is, through bolts 88, secured to a portion in the vicinity of the insertion opening 82b of the antenna covering member 82, while an internal conductor 83b has a leading end penetrating the insertion opening 82b and insertion opening 80a of the antenna covering member 82 and dielectric material 80 and electrically connected to the central portion of the upper surface of the antenna member 44 by means of brazing or the like. Note that the internal conductor 83b may be in the hollow pipe structure or a rod member. The illustrated internal conductor 83b has the hollow pipe structure to an intermediate position thereof and formed into a rod member in the lower end portion thereof. The overall upper surface of the antenna member 44 and the lower surface of the dielectric material 80, the overall surface of the antenna member 44 and the antenna covering member 82, the upper surface and the side surface of the dielectric material 80 and the internal surface of the dielectric-material accommodation portion 82a of the antenna covering member 82 covering the dielectric material 80, the lower end of the internal conductor 83b and the internal surface of the insertion opening 80a of the dielectric material 80, and the lower end of the internal conductor 83b and the upper surface of the central portion of the antenna member 44 are strongly and airtightly joined by brazing 89. Moreover, the antenna covering member 82, the antenna member 44 and the internal conductor 83b are electrically connected. Thus, the overall unit of the antenna member 44 is formed into an airtight structure. The foregoing integrated structure maintains the excellent heat conductivity among elements. In the foregoing case, it is preferable that the material of brazing 89 be metal having resistance which is not considerably strong as compared with that of copper and which has a linear expansion coefficient which is considerably smaller than that of copper, for example, tungsten to prevent heat shock with respect to the dielectric material 80 to realize an absorbing function against linear expansion. Note that it is preferable that the lower end surface of the internal conductor 83b and the antenna member 44 be brazed by copper in place of tungsten to prevent intensification of the resistance of the foregoing portion.

The peripheral portion of the antenna covering member 82 having the lower surface for supporting the antenna member 44 is strongly attached to the peripheral portion of the microwave introduction port 81 of a ceiling portion 4A of the processing container 4 by a plurality of bolts 90 disposed apart from one another in the circumferential direction so that the circular opening in the central portion of the upper wall of the processing container 4 is made to be detachable. In the foregoing case, sealing between the two elements is maintained by a sealing member, for example, an O-ring 86, disposed at the microwave introduction port, that is, between an annular groove formed in the upper surface of the ceiling portion 4A in the vicinity of the central circular opening 81 and the antenna member 44. In the foregoing case, the pressure in the processing container 4 is lowered so that the antenna covering member 82 is pressed against the ceiling portion 4A due to the atmospheric pressure. Therefore, the sealing performance of the microwave introduction port 81 can be maintained without the bolts 90. By providing the bolts 90, the bolts 90 have a function of locating the antenna covering member 82. As an alternative to the O-ring 86, or in addition to the same, an elastic conductor, for example, conductive rubber may be disposed between the upper surface of the ceiling portion 4A and a portion near the peripheral portion of the lower surface of the antenna covering member 82 to prevent leakage of microwave electric power and establish the electrical connection between the two elements.

Although this embodiment has the structure such that the thin copper plate is employed as the antenna member 44 which is joined to the lower surface of the dielectric material 80 or the antenna covering member 82 by brazing 89, the present invention is not limited to this. For example, a pattern of thin copper film formed into the shape of the antenna member including the slits may be formed on the reverse surface of the baked ceramic dielectric material 80 by screen printing or the like, followed by being baked so that a copper foil antenna member is formed. A plan view of the thus-formed antenna member 44 is shown in FIG. 17. In the foregoing case, an opening 44a corresponding to the insertion opening 80a (see FIG. 16) of the dielectric material 80 is undesirably formed in the central portion of the antenna member 44. Therefore, when the antenna member 44 and the peripheral portion of the lower end surface of the internal conductor 83b of the coaxial waveguide pipe 83 are electrically connected to each other, brazing must be performed more accurately as compared with the foregoing embodiments.

Since the antenna member 44 is exposed to the processing space, the antenna member 44 is sputtered in this embodiment. If it is intended to be prevented, a thin quartz glass protective plate or a ceramic protective plate or a thin protective film is required to be provided for the overall lower surface of the antenna member 44 similarly to the foregoing embodiment.

The operation of the apparatus according to this embodiment and having the foregoing structure will now be described.

Initially, the wafer W is, through the gate valve 40, accommodated in the processing container 4 by the conveyance arm, and then the lifter pin (not shown) is moved so that the wafer W is placed on the retaining surface which is the upper surface of the retainer frame 6. Then, the pressure in the processing container 4 is maintained at a predetermined processing pressure, for example, a vacuum level of 0.1 mTorr to tens of mTorr, and then etching gas, for example, $CF_4$ gas, is supplied from the plasma-gas supply nozzle 20 while controlling the flow rate. Simultaneously, microwaves from the microwave generator 50 is, through the rectangular waveguide pipe 52 and the coaxial waveguide pipe 83, supplied to the antenna member 44 so that electrostatic fields exponentially decayed as the distance from the surface of the antenna is elongated are formed in the processing space S. Thus, plasma is generated to perform the etching process. Great electric power (800 KW to 2000 KW) can be supplied to the foregoing apparatus so that an effect similar to that obtainable from the foregoing embodiment is attained.

As a result of supply of great electric power as described above, the antenna member 44 tends to be heated considerably due to Joule heat or heat supplied from radiant heat from plasma in the processing space S. The overall body of the antenna member 44 is, due to plane contact realized by brazing 89, joined to the dielectric material 80 and the antenna covering member 82. The overall upper surface of the dielectric material 80 is joined to the antenna covering member 82 due to plane contact realized by brazing. The outer surface of the lower end of the internal conductor 83b and the dielectric material 80 are joined together in the plane contact manner realized by brazing. Therefore, heat resistance among the elements is very small so that heat of the antenna member 44 is efficiently conducted to the antenna covering member 82 exposed to the atmosphere, followed by being diffused to the atmosphere. Since the antenna member 44 can efficiently and naturally be cooled off, the antenna member 44 cannot be heated excessively. Therefore, partial melting of the antenna member 44 or partial bending and deformation of the same causing separation from the dielectric material 80 can be prevented. In the foregoing case, provision of the cooling fins 84 indicated by imaginary lines shown in FIG. 14 for the antenna covering member 82 enables the cooling efficiency to further be improved. If forcible cooling by means of the cooling fan is performed, the cooling efficiency can further be improved. Since the antenna structure unit consisting of the antenna member 44, the dielectric material 80 and the antenna covering member 82 is formed into the airtight structure in which the foregoing elements are brazed as described above, attaching of the antenna structure unit to the microwave introduction port 81 with sealing performance, the necessity of using another sealing member can be eliminated. In the foregoing case, lowering of the pressure in the processing container 4 causes the antenna covering member 82 to be urged toward the ceiling portion 4A due to atmospheric pressure. Moreover, since the O-ring 86 disposed between the foregoing two elements, excellent airtightness can be maintained.

As the material of the antenna member 44, copper or another conductive material, for example, aluminum may be employed. In a case where prevention of metal contamination caused from the antenna member 44 being sputtered with plasma is intended, quartz glass or a ceramic protective plate having a thickness of, for example, about 1 mm to about 2 mm may be provided for the overall lower surface of the antenna member 44. FIG. 18 is an enlarged view showing a portion in the vicinity of the antenna member 44 in the case where the ceramic protective plate for preventing metal contamination is provided. In the case shown in FIG. 18, a copper antenna member 44 is, by, for example, baking, formed on the lower surface of the ceramic dielectric material 80, and, for example, a ceramic protective plate 92 is formed on the lower surface of the antenna member 44. In the foregoing case, the ceramic protective plate 92 may be made of ceramic which is the same material of the dielectric material 80. The diameter of the ceramic protective plate 92 is set to be larger than the diameter of the antenna member 44 so that the antenna member 44 is completely embedded in the ceramic protective plate 92. As a result, the antenna member 44 can reliably be protected from being sputtered by plasma and, therefore, metal contamination can be prevented. The dielectric material 80 and the ceramic protective plate 92 can be joined strongly in their peripheral portions so that durability is improved. By using the ceramic protective plate 92, a triple structure consisting of the dielectric material 80, the antenna member 44 and the ceramic protective plate 92 can simultaneously and collectively be formed and baked. Thus, the manufacturing method can be simplified. In the illustrated case, the internal conductor 83b is formed into a hollow structure to the lower end thereof.

The foregoing embodiment is formed into the structure such that the process-gas supply nozzle 22 is provided on the side wall of the processing container 4 to supply the processing gas from the side portion. Therefore, the processing gas traverses the upper surface of the wafer W or even if a plurality of the nozzles 22 are provided point symmetrically about the center of the retainer frame 6, the processing gas stagnates adjacent to the central portion above the wafer. In the foregoing case, there is a fear that the plasma process cannot be performed uniformly over the surface of the wafer. Although it might be considered feasible to dispose a shower head structure comprising a glass pipe, which does not disorder the electric field, above the retainer frame 6, there is a fear of generation of plasma in the head structure. Therefore, the foregoing structure cannot be employed practically. Therefore, a structure may be employed in which a processing gas introduction portion is formed in the antenna covering member 82 so as to cause the antenna structure to as well as serve as the gas introduction means in order to eliminate the foregoing fear.

Figure 19:
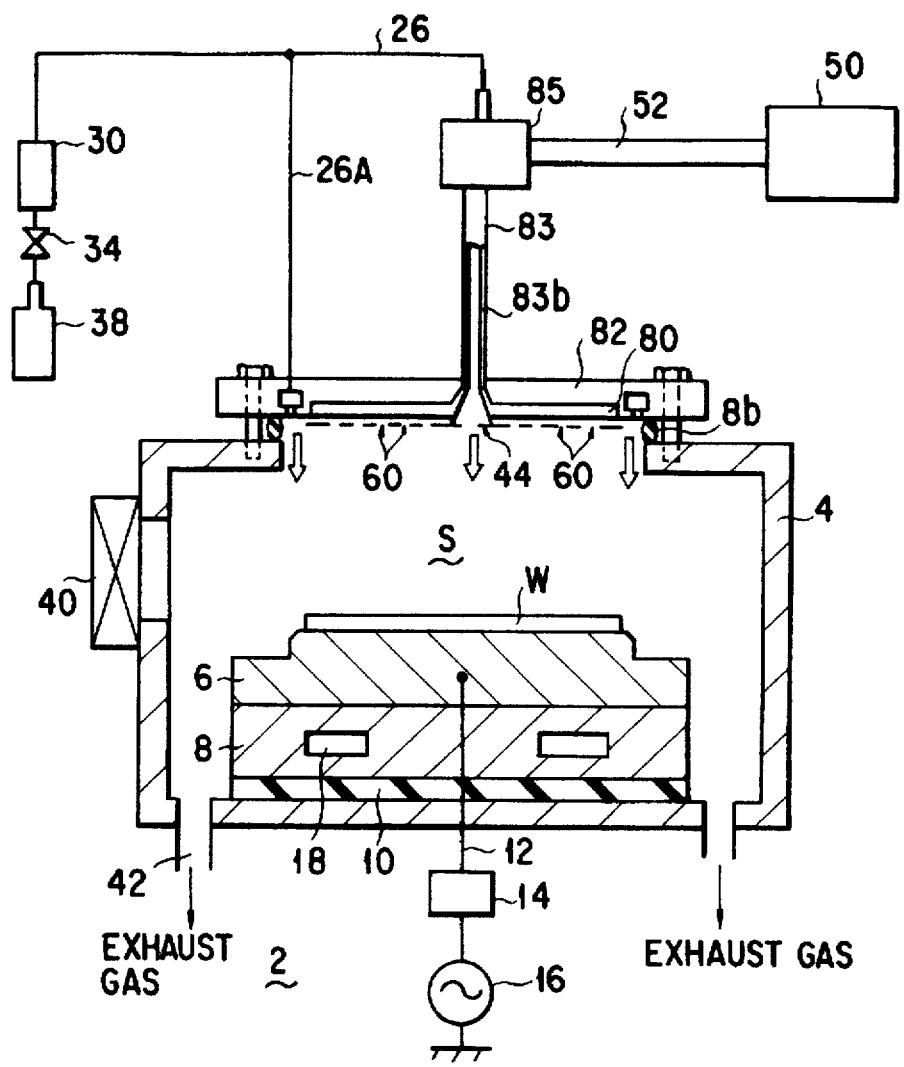
FIG. 19 is a schematic view showing the overall body of a plasma processing apparatus according to a fourth embodiment of the present invention.
Figure 20:
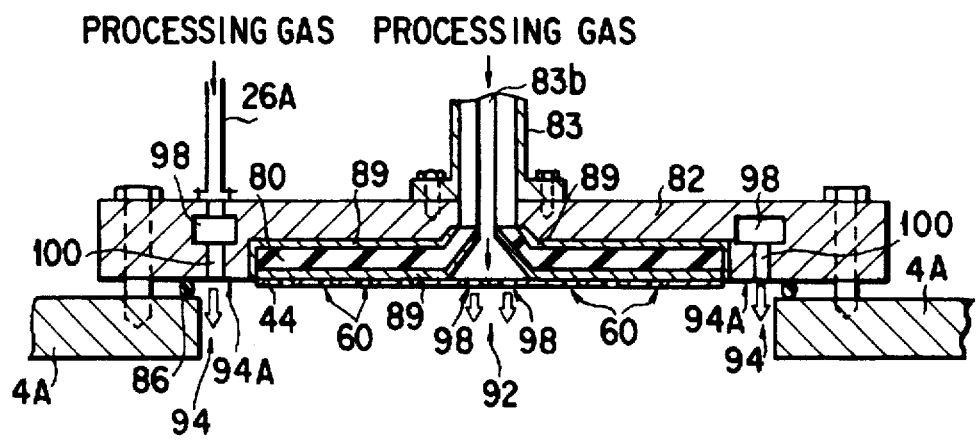
FIG. 20 is a cross sectional view showing the state where the antenna member of the apparatus shown in FIG. 19 is attached.
Figure 21:
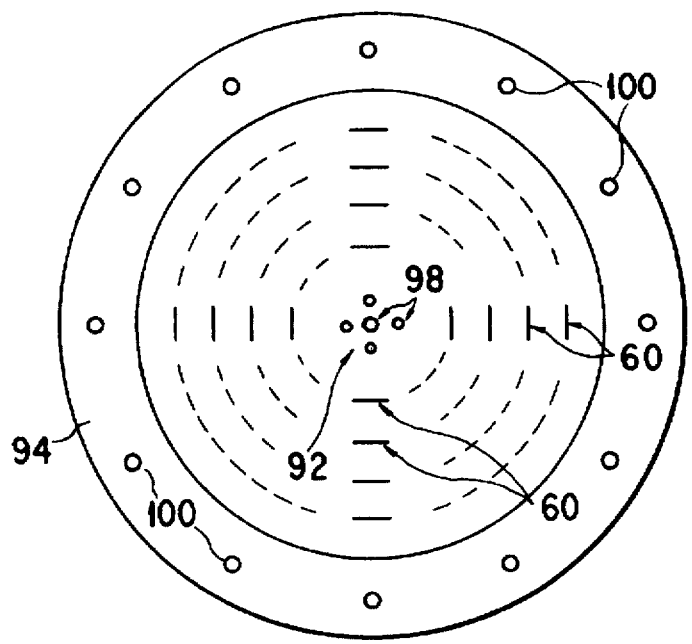
FIG. 21 is a plan view showing the antenna member and a portion in the vicinity of the antenna member shown in FIG. 20.
Figure 22:
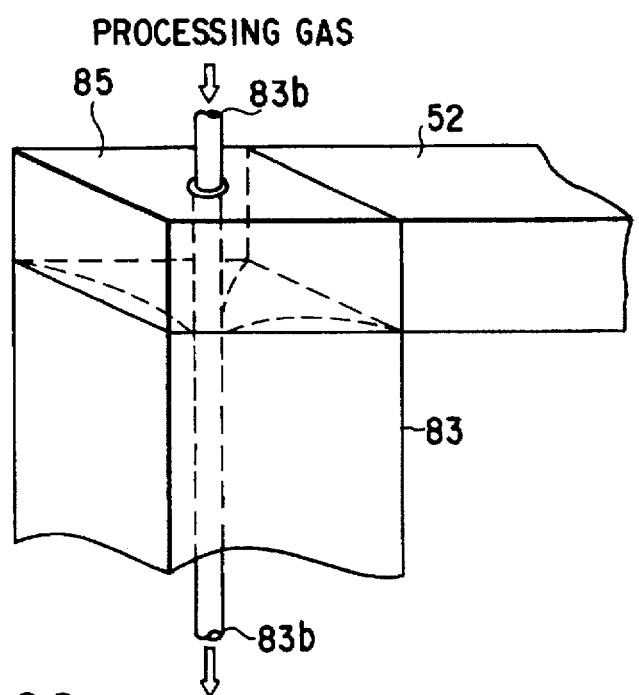
FIG. 22 is a perspective view showing a converter of the apparatus shown in FIG. 19 disposed between a rectangular waveguide tube and a coaxial waveguide tube.

FIG. 19 is a cross sectional view showing a fourth embodiment in which the processing gas introduction portion is provided for the antenna covering member. FIG. 20 is an enlarged view showing the antenna structure having the foregoing structure. FIG. 21 is a plan view showing the antenna member shown in FIG. 20 and a portion in the vicinity of the same. FIG. 22 is an enlarged view showing a portion including a converter. In this embodiment, a main processing-gas introduction portion 92 is formed in the central portion of the antenna covering member 82 as illustrated. Moreover, a plurality of sub processing-gas introduction portions 94 are formed in the peripheral portion of the antenna covering member 82. Specifically, the main processing-gas introduction portion 92 has a structure such that the internal conductor 83b of the coaxial waveguide pipe 83 is a hollow tube including the hollow lower end as well as the intermediate portion thereof, the hollow tube also serving as a processing gas supply passage through which the processing gas is allowed to flow. That is, a circular portion of the antenna member 44, which is joined to the lower end surface of the internal conductor 83b comprising the hollow tube has a plurality of gas holes 98 connected to the processing space S. It is preferable that the number of foregoing gas holes 98 be enlarged within a permitted space as shown in FIG. 21. An end of the gas supply passage 26 having another end connected to the processing-gas source 38 is connected to the hollow internal conductor 83b extending from the converter 85 for joining the rectangular waveguide pipe 52 and the coaxial waveguide pipe 83. Thus, the processing gas is introduced into the processing space S through the internal conductor 83b.

The sub processing-gas introduction portions 94 formed in the vicinity of the antenna covering member 82 has a structure formed such that an annular gas header 98 is formed along the peripheral portion of the antenna covering member 82; and a plurality of sub gas holes 100 formed from the gas header 98 to the processing space S are formed. It is preferable that the sub gas holes 100 be formed in the direction of the circumference of the antenna covering member 82 at predetermined pitches as shown in FIG. 21. A branched pipe 26A branched from the gas supply passage is connected to the gas header 98 so as to be supplied with the same processing gas as that supplied to the processing gas introduction portion 92.

By causing the antenna structure to as well as serve as the processing gas introduction means, the cooling efficiency of the antenna member 44 can be improved similar to the foregoing embodiment. Moreover, since the processing gas can be supplied from a position above the central portion of the wafer W, the processing gas can be uniformly supplied and diffused over the surface of the wafer. Thus, the plasma processing can be uniformly performed over the surface of the wafer. In particular, by providing the sub processing-gas introduction portions 94 in the peripheral portion of the antenna covering member 82, a sufficiently large quantity of processing gas can be supplied to the peripheral portion of the wafer which tends to be supplied with thin processing gas as compared with the central portion. As a result, the plasma process can be performed further uniformly over the surface of the wafer. By forming a gas discharge surface 94A of the sub processing-gas introduction portions 94 into a tapered shape facing the central portion of the retainer frame in place of a horizontal surface, the direction in which the processing gas is jetted out can be inclined toward the center of the wafer. Therefore, an expectation can be made that the plasma process can be performed uniformly over the surface of the wafer.

Figure 23:
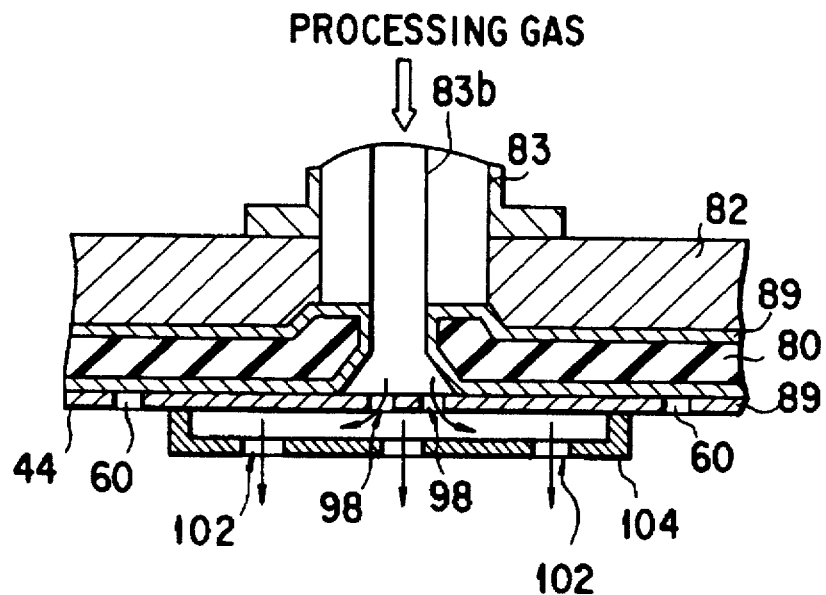
FIG. 23 is a diagram showing a modification of main gas-introduction portion of the apparatus according to the fourth embodiment of the present invention.

A blower plate 104 having a multiplicity of gas jetting-out ports 102 may be provided on the lower surface of the main processing-gas introduction portion as shown in FIG. 23 which is a partially-enlarged view. In the foregoing case, the blower plate 104 is, by brazing or the like, attached to a no-slit area of the central portion of the lower surface of the antenna member 44 in which the slits 60 are not formed in such a manner that the peripheral portion of the blower plate 104 is bent upwards. The processing gas, allowed to flow downwards through the gas holes 98, is discharged through a multiplicity of gas jetting-out ports 102 so that the processing gas is further diffused and supplied to the processing space S.

Figure 24:
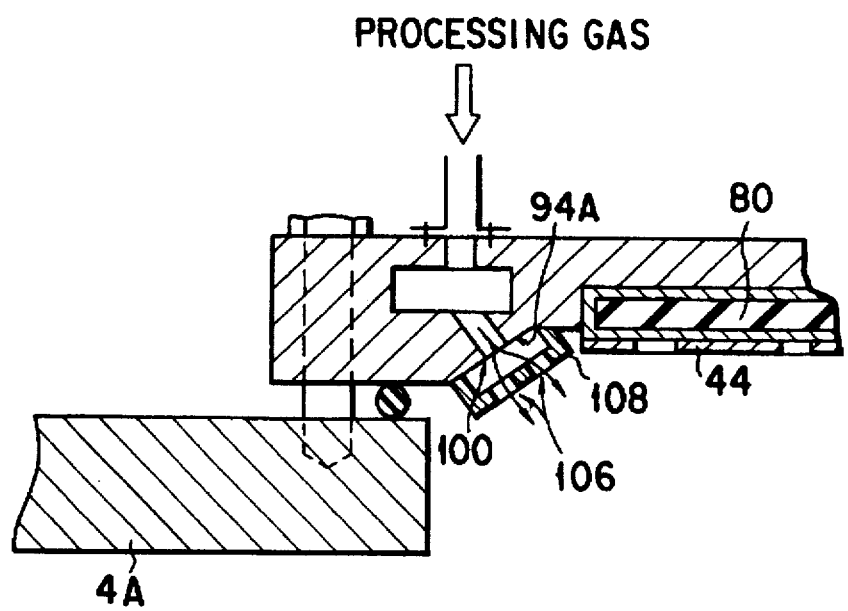
FIG. 24 is a diagram showing a modification of a sub gas-introduction portion of the apparatus according to the fourth embodiment of the present invention.

Furthermore, as shown in FIG. 24 which is a partially enlarged view, a blower plate 108 having a plurality of gas jet-out ports 106 may be provided for the lower surface of the sub processing-gas introduction portions 94 formed in the peripheral portion of the antenna covering member 82. In the foregoing case, it is preferable that the blower plate 108 be formed into an annular shape along the circumference direction of the antenna covering member 82. As compared with the structure shown in FIG. 21, a larger number of gas jet-out ports 106 can be formed. Since the gas discharge surface 94A is inclined to face the center of the retainer frame, the plasma process can be expected to be performed further uniformly over the surface of the wafer. As an alternative to the blower plate 108, the processing gas may directly be supplied toward the diagonally downwards through sub gas holes 80 of the gas discharge surface 94A formed into a tapered surface. As a matter of course, the foregoing main process-gas introduction portion and the sub processing-gas introduction portion may be combined with the embodiments shown in FIGS. 15 and 18.

The plasma processing apparatus according to the foregoing embodiment attains the following excellent advantages.

Since the structure of the flat antenna member is not provided in the processing chamber but the same is disposed so as to be exposed to the atmosphere so that the antenna member is cooled with air due to atmospheric radiation, the structure can be protected from being heated excessively with a simple structure. Thus, the antenna member cannot be bent or deformed, and a partial melting of the same can be prevented. As a result, durability can be improved. Since the surfaces of the members of the antenna structure are joined by, for example, brazing, heat conductivity among the members can be improved. Thus, the heat radiation efficiency of the antenna members can further be improved.

Since the antenna structure consisting of the antenna covering member for covering the antenna member and the dielectric material are formed into the airtight structure to seal the microwave introduction port, an individual sealing means for establishing airtightness in the processing container is not required. Therefore, the structure of the apparatus can be simplified.

By providing two functions for the antenna structure by forming the processing gas introduction portion, the processing gas can be supplied from a position above the central portion of the member to be processed with a simple structure. Therefore, the processing gas can be supplied uniformly and, therefore, the plasma process can be performed uniformly over the surface of the wafer.

Since the sub processing gas introduction portion is formed in the antenna structure at a position above the peripheral portion of the member to be processed, the processing gas can be supplied to the peripheral portion of the member to be processed in a sufficiently large quantity. Therefore, the plasma process can further uniformly be performed over the surface of the wafer. By providing the blower plate having gas jetting-out ports in the processing gas introduction portion and the sub processing gas introduction portion, the processing gas can be supplied while preventing diffusion. Thus, the plasma process can be performed further uniformly over the surface of the wafer.

Since the inner conductor of the coaxial waveguide pipe is used as the gas supply passage, the necessity of individually providing the gas supply passage can be eliminated. Therefore, the structure can be simplified and, therefore, the cost can be reduced.

Although the foregoing embodiments have been described about the process of plasma etching the semiconductor wafer, the present invention is not limited to this. The present invention may be applied to any apparatus that uses plasma. The present invention may be applied to, for example, a plasma ashing apparatus, a plasma CVD apparatus and the like. Moreover, the member to be processed is not limited to the semiconductor wafer. The member to be processed may be another member to be processed, for example, a LCD substrate, the size of which has been desired to be enlarged.

The distribution of the slits in the flat antenna member is not limited to the concentric distribution or the spiral distribution. Any distribution may be employed if no electromagnetic wave is not substantially oscillated in the processing space and electrostatic field can be formed. It is preferable that the distribution be arbitrarily selected to be adaptable to the shape of the member to be processed. If a LCD substrate is used as the member to be processed, slits may be disposed along rectangular lines having a common center.

As described above, according to the plasma processing apparatus according to the present invention, the following excellent advantages can be realized.

Since microwaves are supplied to the flat antenna member to form electrostatic fields exponentially decayed as the distance from the surface of the antenna is elongated in the processing space so as to generate plasma in the processing space, electric power can be supplied regardless of the density of plasma. Therefore, as compared with the case where electric power is supplied by using electromagnetic wave, greater electric power can be used to uniformly and stably form higher density plasma over a wide region.

If the radial structure is employed in which the slits are formed concentrically or spirally such that the lengths of the slits are made to be slightly longer as the slits are disposed toward the outside in the radial direction of the antenna member, the electromagnetic field in the peripheral portion of the antenna member can be intensified. Therefore, lowering of the density of plasma in the peripheral portion of the processing region corresponding to the peripheral portion of the antenna member can be compensated. Therefore, the density of plasma can further be made to be uniform over the surface of the wafer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus comprising: a processing container;

support means disposed in said processing container, supporting a member to be processed which has a surface to be processed;

a microwave generator for generating microwaves;

a waveguide tube for guiding microwaves generated by said microwave generator into said processing container;

a flat antenna member electrically connected to said waveguide tube, facing, apart for an interval, said surface of said member to be processed, which is supported by said support means, and disposed to define a plasma forming region between said flat antenna member and said surface of said member to be processed; and means for supplying processing gas to said plasma forming region, said antenna member including a conductive plate and a multiplicity of slits formed in the conductive plate, the distribution and dimensions of slits being set so that an electrostatic field exponentially attenuating with the distance from said antenna member, is formed in said plasma forming region to generate plasma of said processing gas in said plasma forming region.

2. A plasma processing apparatus according to claim 1, wherein said conductive plate has a center and a peripheral portion, said slits are formed on a multiplicity of loops, the diameters of which gratualy increase from the center of said conductive plate toward the outer periphery extend along said loops, and are spaced apart from one another in both lengthwise and widthwise directions, said slits have lengths shorter than the guide wavelength of said microwaves, and the widthwise directional interval between adjacent slits is set to be shorter than said guide wavelength of said microwave.

3. A plasma processing apparatus according to claim 2, wherein each of said slits has a length of ±30% of said guide wavelength centered with respect to half of said guide wavelength of said microwave.

4. A plasma processing apparatus according to claim 3, wherein said slits are spaced apart in the widthwise direction at intervals of 5% to 50% of the guide wavelength of said microwave.

5. A plasma processing apparatus according to claim 2, wherein said conductive plate has a metal disc and said slits are concentrically or spirally disposed in said metal disc.

6. A plasma processing apparatus according to claim 2, wherein phases of electrostatic fields formed by said slits adjacent in the radial direction of said antenna member are made to be opposite.

7. A plasma processing apparatus according to claim 2, wherein lengths of said slits are sequentially enlarged in a radial direction from the central portion of said antenna member toward the outer periphery of said antenna member, so that the density of plasma in the outer periphery of said antenna member is higher than that in the central portion of said antenna member.

8. A plasma processing apparatus according to claim 2, wherein outermost slits in said conductive plate are longer than the other slits.

9. A plasma processing apparatus according to claim 1, further comprising an insulating protective plate for covering the surface of said flat antenna member that faces said member to be processed.

10. A plasma processing apparatus according to claim 8, further comprising a dielectric member for covering a surface of said flat antenna member opposite to the surface which faces said member to be processed to shorten the wavelength of said microwaves to be supplied from the waveguide tube to make the wavelength to be the guide wavelength.

11. A plasma processing apparatus according to claim 10, wherein said protective plate, said flat antenna member and said dielectric member are formed integrally by brazing.

12. A plasma processing apparatus according to claim 1, wherein said container has an outer wall having an opening, at an interval, facing said surface of said member to be processed which is supported by said support means and a surrounding portion for surrounding said opening, and which further comprises an antenna covering member for covering and supporting said antenna member so that said flat antenna member, at an interval, faces the surface of said member to be processed supported by said support means through said opening and means for mounting said antenna covering member to said outer peripheral portion so that said opening is closed.

13. A plasma processing apparatus according to claim 12, wherein said antenna covering member has a heat radiation surface exposed to the atmosphere so as to be cooled by the atmosphere.

14. A plasma processing apparatus according to claim 13, further comprising:
  a dielectric member disposed between said antenna covering member and said flat antenna member to shorten the wavelength of microwave to be supplied to said antenna member so as to make the wavelength to be the guide wavelength; and
  means for integrally attaching said antenna covering member, said antenna member and said dielectric member in such a manner that gaps among said antenna covering member, said antenna member and said dielectric member are filled with the attaching means.

15. A plasma processing apparatus according to claim 14, wherein said antenna covering member, said antenna member and said dielectric member face mutually and said attaching means has a good heat conductivity.

16. A plasma processing apparatus according to claim 15, wherein said antenna covering member includes a plate-like body having one surface having a circular recess having a central axis, the other surface exposed to the atmosphere and a through hole penetrating between said two surfaces coaxially with said central axis and allowed to communicate with said recess;
  said dielectric member has a disc-like body disposed coaxially in said recess and having a through hole penetrating coaxially with said central axis;
  said flat antenna member is attached to said one surface of said antenna covering member and said body of said dielectric member in such a manner that said flat antenna member is disposed coaxially with said antenna covering member and said body of said dielectric member to cover said recess; and
  said waveguide tube has a tubular external conductor having an end attached to the other surface of said antenna covering member and a central conductor having an end allowed to pass through said through holes of said antenna covering member and said body of said dielectric member and electrically connected to the center of said antenna member.

17. A plasma processing apparatus according to claim 16, wherein said central conductor of said waveguide tube is formed into a tubular shape having one opened end facing the central portion of said antenna member and the other opened end;
  said means for supplying the processing gas has a processing gas source and a supply line for connecting said processing gas source to the other opened end of said central conductor of said waveguide tube; and
  said antenna member has at least one gas passing hole formed in the central portion thereof;
  whereby said processing gas is jetted out to said plasma forming region from said supply line through said central conductor and said gas passing hole.

18. A plasma processing apparatus according to claim 17, wherein said means for supplying said processing gas has sub-supply means for supplying the processing gas to said plasma forming region through the outer periphery of said antenna covering member.

19. A plasma processing apparatus according to claim 18, wherein said sub-supply means includes a plurality of sub-gas-passing holes formed in the outer periphery of said antenna covering member at predetermined intervals in the circumferential direction and opened in one surface of said antenna covering member and means for supplying the processing gas from said gas supply source to said sub-gas-passing holes, said processing gas being jetted out to said plasma forming region from said means for supplying said processing gas to said sub-gas-passing holes through said sub gas-passing holes.

20. A plasma processing apparatus according to claim 19, further comprising a blower plate disposed on at least one of gas jetting out sides of said gas passage hole of said antenna member and said sub-gas-passing holes of said antenna covering member and having a plurality of gas jetting-out ports to divide the processing gas to be jetted out into a plurality of jets.

21. A plasma processing apparatus according to claim 19, further comprising a blower plate disposed on the gas jetting-out side of said sub gas-passing holes of said antenna covering member and having a plurality of gas jetting-out ports directed to the center in such a manner that said processing gas to be jetted out is divided into a plurality of jets directed to the center of said plasma forming region.

22. A plasma processing apparatus comprising:

a processing container;

support means disposed in said processing container, for supporting a member to be processed which has a surface to be processed;

a microwave generator for generating microwaves;

a waveguide tube for guiding microwaves generated by said microwave generator into said processing container and a plurality of branched waveguide tubes branched from said waveguide tube; and a flat antenna member electrically connected to said waveguide tube, facing, apart for an interval, said surface of said member to be processed, which is supported by said support means, and disposed to define a plasma forming region between said flat antenna member and said surface of said member to be processed, said antenna member including a conductive plate and a multiplicity of slits formed in the conductive plate, the distribution and dimensions of slits being set so that an electrostatic field exponentially attenuating with the distance from said antenna member, is formed in said plasma forming region to generate plasma of said processing gas in said plasma forming region.

23. A plasma processing apparatus according to claim 22, wherein said branched waveguide tubes have a plurality of partition walls stood erect on said antenna member and extending in parallel to one another, each of said branched waveguide tubes is defined by adjacent two partition walls, and said slits extend between said adjacent two partition walls while having a predetermined angle from a direction in which said partition wall extends and are arranged adjacent to one another in the widthwise direction along said partition walls.

24. A plasma processing apparatus according to claim 23, wherein each of said slits has a length shorter than the guide wavelength of said microwave and the widthwise interval of adjacent slits is set to be shorter than said guide wavelength of said microwave.

* * * * *

UNITED STATES PATENT AND TRADEMARK OFFICE
CERTIFICATE OF CORRECTION

PATENT NO. : 5,698,036
DATED : December 16, 1997
INVENTOR(S) : Nubuo ISHII et al.

It is certified that error appears in the above-identified patent and that said Letters Patent is hereby corrected as shown below:

On the title page, Item[75], the last Inventor should read:

-- Yasuhiro Horiike, 3-2-12 Higashifushimi, Hoya-shi, Tokyo --

On the title page, Item [73], the last Assignee should read:

-- Yasuhiro Horiike, Tokyo --

Signed and Sealed this

Tenth Day of February, 1998

Attest:

BRUCE LEHMAN

*Attesting Officer*    *Commissioner of Patents and Trademarks*